United States Patent
Liu et al.

(10) Patent No.: US 11,424,123 B2
(45) Date of Patent: Aug. 23, 2022

(54) FORMING A SEMICONDUCTOR FEATURE USING ATOMIC LAYER ETCH

(71) Applicant: Tokyo Electron Limited, Tokyo (JP)

(72) Inventors: Eric Chih-Fang Liu, Albany, NY (US);
Akiteru Ko, Albany, NY (US);
Angelique Raley, Albany, NY (US);
Henan Zhang, Albany, NY (US); Shan Hu, Albany, NY (US); Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/851,414

(22) Filed: Apr. 17, 2020

(65) Prior Publication Data
US 2021/0265164 A1    Aug. 26, 2021

Related U.S. Application Data

(60) Provisional application No. 62/981,362, filed on Feb. 25, 2020.

(51) Int. Cl.
*H01L 21/033* (2006.01)
*H01L 21/027* (2006.01)
*H01L 21/311* (2006.01)
*H01L 21/306* (2006.01)
*H01L 21/3213* (2006.01)
*H01L 21/67* (2006.01)
*H01L 21/3065* (2006.01)

(52) U.S. Cl.
CPC ...... *H01L 21/0337* (2013.01); *H01L 21/0273* (2013.01); *H01L 21/3065* (2013.01); *H01L 21/30608* (2013.01); *H01L 21/31116* (2013.01); *H01L 21/32136* (2013.01); *H01L 21/67075* (2013.01)

(58) Field of Classification Search
CPC .......... H01L 21/0337; H01L 21/67075; H01L 21/32136; H01L 21/0273; H01L 21/30608; H01L 21/3065; H01L 21/31116; H01L 21/30604; H01L 21/32134; H01L 21/32137
USPC ................ 438/714, 717, 719, 725, 736, 758
See application file for complete search history.

(56) References Cited

U.S. PATENT DOCUMENTS

2004/0029052 A1   2/2004  Park et al.
2005/0208434 A1   9/2005  Mosden et al.
(Continued)

OTHER PUBLICATIONS

International Searching Authority, Notification of Transmittal of the International Search Report and the Written Opinion of the International Searching Authority, or the Declaration, issued in International Application No. PCT/US2021/018374, dated Jun. 10, 2021, total 10 pages.

*Primary Examiner* — Lan Vinh
(74) *Attorney, Agent, or Firm* — Slater Matsil, LLP

(57) ABSTRACT

In certain embodiments, a method of forming a semiconductor device includes forming a patterned resist layer over a hard mask layer using an extreme ultraviolet (EUV) lithography process. The hard mask layer is disposed over a substrate. The method includes patterning the hard mask layer using the patterned resist layer as an etch mask. The method includes smoothing the hard mask layer by forming, using a first atomic layer etch step, a first layer by converting a first portion of the hard mask layer, and by removing, using a second atomic layer etch step, the first layer.

20 Claims, 12 Drawing Sheets

(56) References Cited

U.S. PATENT DOCUMENTS

| | | |
|---|---|---|
| 2009/0093120 A1 | 4/2009 | Hirota |
| 2011/0061810 A1 | 3/2011 | Ganguly et al. |
| 2013/0214391 A1* | 8/2013 | Choi ..................... H01L 23/296 |
| | | 257/622 |
| 2014/0120726 A1* | 5/2014 | Nemani ............ H01J 37/32009 |
| | | 438/694 |
| 2015/0380215 A1* | 12/2015 | Nemani .............. H01J 37/3244 |
| | | 156/345.34 |
| 2017/0229317 A1* | 8/2017 | Shen ....................... C23C 14/50 |
| 2018/0068852 A1* | 3/2018 | Cottle ................. H01L 21/0335 |
| 2018/0138054 A1 | 5/2018 | Romero et al. |

* cited by examiner

Stage 102e

FORMING A SEMICONDUCTOR FEATURE USING ATOMIC LAYER ETCH

RELATED APPLICATIONS

This application claims priority to U.S. Provisional Application No. 62/981,362, filed on Feb. 25, 2020, which application is incorporated by reference in its entirety.

TECHNICAL FIELD

The present disclosure relates generally to a system and method semiconductor fabrication, and, in particular embodiments, to forming a semiconductor feature using atomic layer etch.

BACKGROUND

Generally, semiconductor devices, such as integrated circuits (ICs), are fabricated by sequentially depositing and patterning layers of dielectric, conductive, and semiconductor materials over a semiconductor substrate, using photolithography and etching to form structures that operate as circuit components (e.g., transistors, resistors, and capacitors) and as interconnect elements (e.g., conductive lines, contacts, and vias). The semiconductor industry has repeatedly reduced the minimum feature sizes in semiconductor devices to a few nanometers with innovations in lithography (e.g., immersion lithography and multiple patterning) and other areas to increase the packing density of components, thereby reducing the cost of ICs.

This miniaturization to a few nanometers has intensified various challenges associated with semiconductor fabrication. Fabrication processes, including plasma and other processes, are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer.

At each successive technology node, feature sizes are shrunk to roughly double the component packing density. A direct method for printing the higher resolution patterns is to reduce the wavelength of the light source. The 248 nm deep ultraviolet (DUV) radiation source a (e.g., a krypton fluoride (KrF) laser), used to expose critical patterns at the 250 nm and 130 nm nodes, was replaced by the 193 nm argon fluoride (ArF) laser, starting at the 90 nm node. Features down to 35 nm may be printed using 193 nm lithography with resolution enhancement techniques, such as immersion lithography. The 193 nm optics is further extended to 14 nm and even 10 nm nodes using multiple patterning techniques, but at higher cost and processing complexity associated with the additional masks. At the sub-10 nm node regime, DUV may be replaced by the even shorter 13.5 nm wavelength extreme ultraviolet (EUV) technology.

SUMMARY

In certain embodiments, a method of forming a semiconductor device includes forming a patterned resist layer over a hard mask layer using an EUV lithography process. The hard mask layer is disposed over a substrate. The method includes patterning the hard mask layer using the patterned resist layer as an etch mask. The method includes smoothing the hard mask layer by forming, using a first atomic layer etch step, a first layer by converting a first portion of the hard mask layer, and by removing, using a second atomic layer etch step, the first layer.

In certain embodiments, a method of forming a semiconductor device includes forming a patterned resist layer over a hard mask layer using an EUV lithography process. The hard mask layer is disposed over a substrate. The method includes patterning the hard mask layer using the patterned resist layer as an etch mask. The method includes, in a plasma process chamber, executing a self-limiting atomic layer etch process to modify the hard mask layer. The self-limiting atomic layer etch process includes converting a first portion of the hard mask layer to a first layer, purging the plasma process chamber to remove all previously used gas chemistries, and removing the first layer.

In certain embodiments, a method of forming a semiconductor device includes forming a patterned resist layer over a hard mask layer using an EUV lithography process. The hard mask layer is disposed over a substrate. The method includes patterning the hard mask layer using the patterned resist layer as an etch mask. The method includes performing a cyclic process to modify the hard mask layer. The cyclic process includes forming, using a first atomic layer etch step, a layer by converting a portion of the hard mask layer, and removing, using a second atomic layer etch step, the layer.

BRIEF DESCRIPTION OF THE DRAWINGS

For a more complete understanding of the present disclosure, and advantages thereof, reference is now made to the following descriptions taken in conjunction with the accompanying drawings, in which.

DETAILED DESCRIPTION OF ILLUSTRATIVE EMBODIMENTS

Figure 1A:
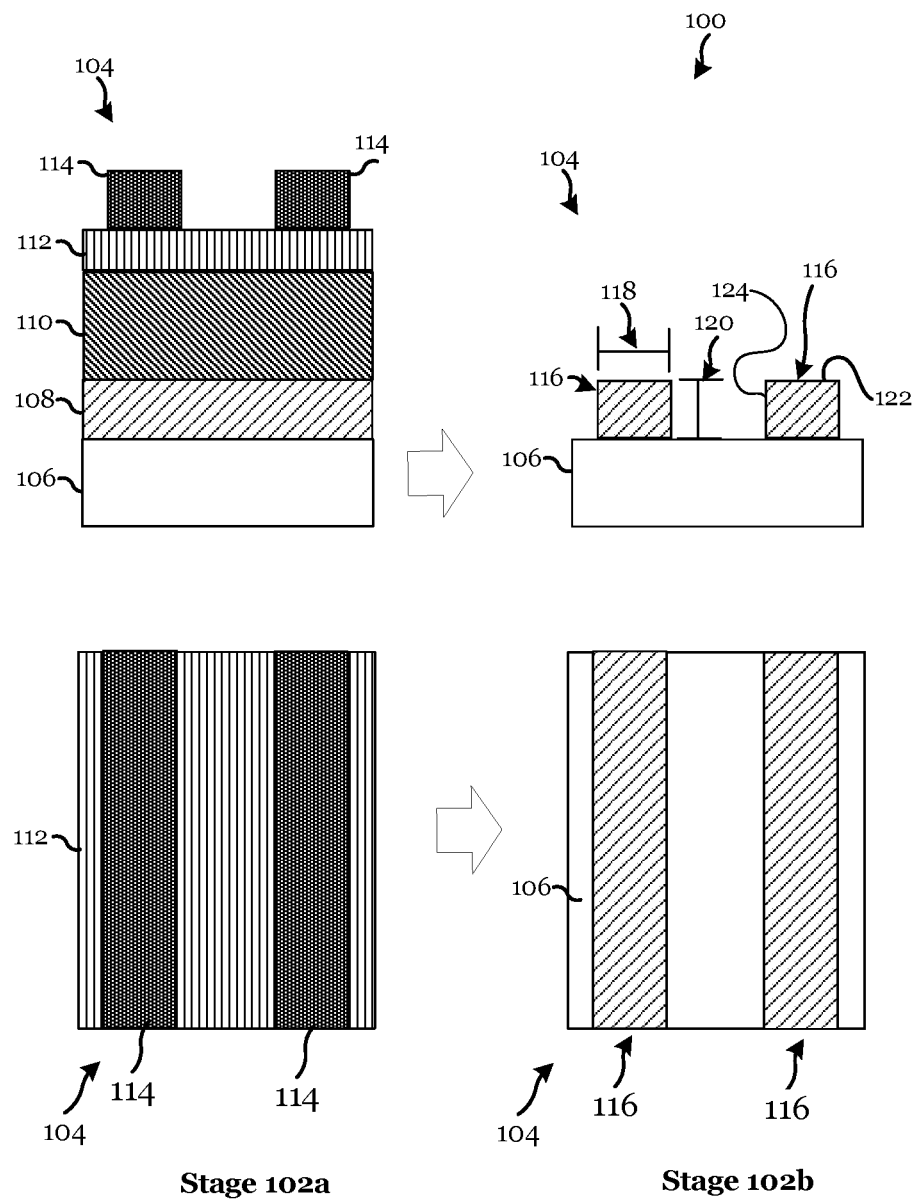
FIGS. 1A-1C illustrate cross-sectional views and corresponding top views of a process for forming a semiconductor device, according to certain embodiments of this disclosure.

The shorter 13.5 nm wavelength used in EUV lithography may offer a high resolution single patterning capability, for example, for printing a dense array of 13 nm resist lines and spaces (26 nm pitch) using only one mask. In contrast, two to four masks may be used to achieve an equivalent resolution with 193 nm DUV lithography using multiple patterning techniques. It is estimated that manufacturing a typical IC design at the 7 nm node would be an unacceptably long and expensive process requiring more than 80 DUV 193 nm masks, whereas EUV may bring the mask count down to a more manageable range of about 60 masks. However, EUV technology has a number of engineering difficulties arising from the high energy of photons at the short 13.5 nm wavelength, as known to persons skilled in the art. This disclosure describes embodiments of methods to mitigate some of these issues.

One issue with the 14.3 times higher energy of the EUV photon (92 eV vs. 6.4 eV) is the correspondingly lower number of photons available at a fixed exposure to define the edges of an exposed region. For example, a 1 nm$^2$ area of EUV photoresist is exposed to an average of just 10 photons for 15 mJ/cm$^2$ exposure compared to 143 photons for 193 nm DUV resist. However, some regions would randomly receive more than the average number of photons while other regions would receive less. Besides, as the scanner steps from die to die, the same region on each die on the wafer could receive randomly different exposures. The random variation in the photon count, also known as shot noise, follows a Poisson process, resulting in exposure fluctuations having a percentage variation (ratio of the root mean squared value to the average value (□□□)) that is √(14.3) or about 3.8 times larger in EUV lithography relative to DUV at the same exposure level. The impact of exposure fluctuations on the exposed pattern gets aggravated as the feature sizes get smaller. The randomness in the locations where the photons interact with the resist to cause chemical reactions translates to a corresponding blurring of the edge of an exposed line. This loss of resolution is more severe for EUV (relative to DUV) because the mean distance between the locations of photon-resist interactions increases as the photon density is reduced.

Another issue associated with the high photon energy is that a photon absorption event (within the resist or a layer underlying the resist layer) is accompanied by generation of high-energy photoelectrons that quickly cascade into secondary emission of lower energy electrons. As these electrons get scattered around in a stochastic process along random trajectories, often referred to as random walk, some may cause chemical reactions in the resist considerably far from where the original photon was absorbed. As a result, there may be a random secondary exposure over a region beyond the boundaries defined by the original pattern. This secondary exposure is another stochastic process creating a random pattern superimposed on the image generated exclusively from the photon-resist interactions.

The impact of the unwanted resist stochastics, such as shot noise and secondary electron exposure include random loss of resolution and image contrast degradation, and observable line edge roughness (LER) and linewidth roughness (LWR). Roughness of features (e.g., so-called lines) may include line edge roughness and line width roughness. Line edge roughness generally refers to the variability in shape of a surface (e.g., a top surface or a side surface) of a feature. Line width roughness generally refers to the variations in the width of the line that result from line edge roughness on opposing surfaces (e.g., opposing side surfaces) of the line.

Following EUV patterning, one or more layers of a semiconductor device (e.g., a semiconductor wafer) may be removed using an etching process, such as a plasma etching process. Plasma processing techniques, such as reactive ion etching (RIE), plasma-enhanced chemical vapor deposition (PECVD), plasma-enhanced atomic layer etch and deposition (PEALE and PEALD), sputter etch, physical vapor deposition (PVD), and cyclic plasma processing (e.g., cycles of alternating deposition and etch) are routinely used in fabricating ICs.

The patterning defects described above that are formed in the photoresist layer are transferred into the underlying hard mask and other layers used to pattern the features of interest (metal lines, fins, gate lines, contact holes, and others). In addition, as another example, a typical subsequent plasma etch process for etching an underlying layer (e.g., a hard mask layer) using the photoresist (with its pattern defects) as an etch mask may in some cases even may exacerbate the pattern defects or on the least inadequately reduce the pattern defects in the etched underlying layer.

Accordingly, features formed from this EUV patterning and plasma etch process suffer from patterning defects, including undesirable levels of surface and/or edge roughness and an inability to adequately control critical dimensions (e.g., a lateral dimension and/or a vertical dimension) of the resulting features.

In certain embodiments of this disclosure, an atomic layer etch process is used to smooth surfaces of features of a semiconductor device and to more accurately produce particular dimensions for those features. Certain embodiments of this disclosure reduce or eliminate surface and/or edge roughness of features of a patterned resist layer formed using an EUV lithography process. Additionally or alternatively, certain embodiments of this disclosure improve the ability to precisely control critical dimensions of features of a patterned resist layer formed using an EUV lithography process, which is particularly difficult at smaller technology nodes (e.g., at sub-seven nanometer level).

As described in greater detail below, rather than a single plasma etch step, the atomic layer etch process may include repeatedly performing two primary steps, a surface modification step in which a surface layer is formed by converting a portion of a layer (e.g., a top surface of a hard mask layer) and a layer activation step in which the surface layer is removed. In certain embodiments, both of these steps are highly controllable and self-limiting, which may contribute to reduction or elimination of line edge roughness and/or the improvement in critical dimension control.

Figure 1B:
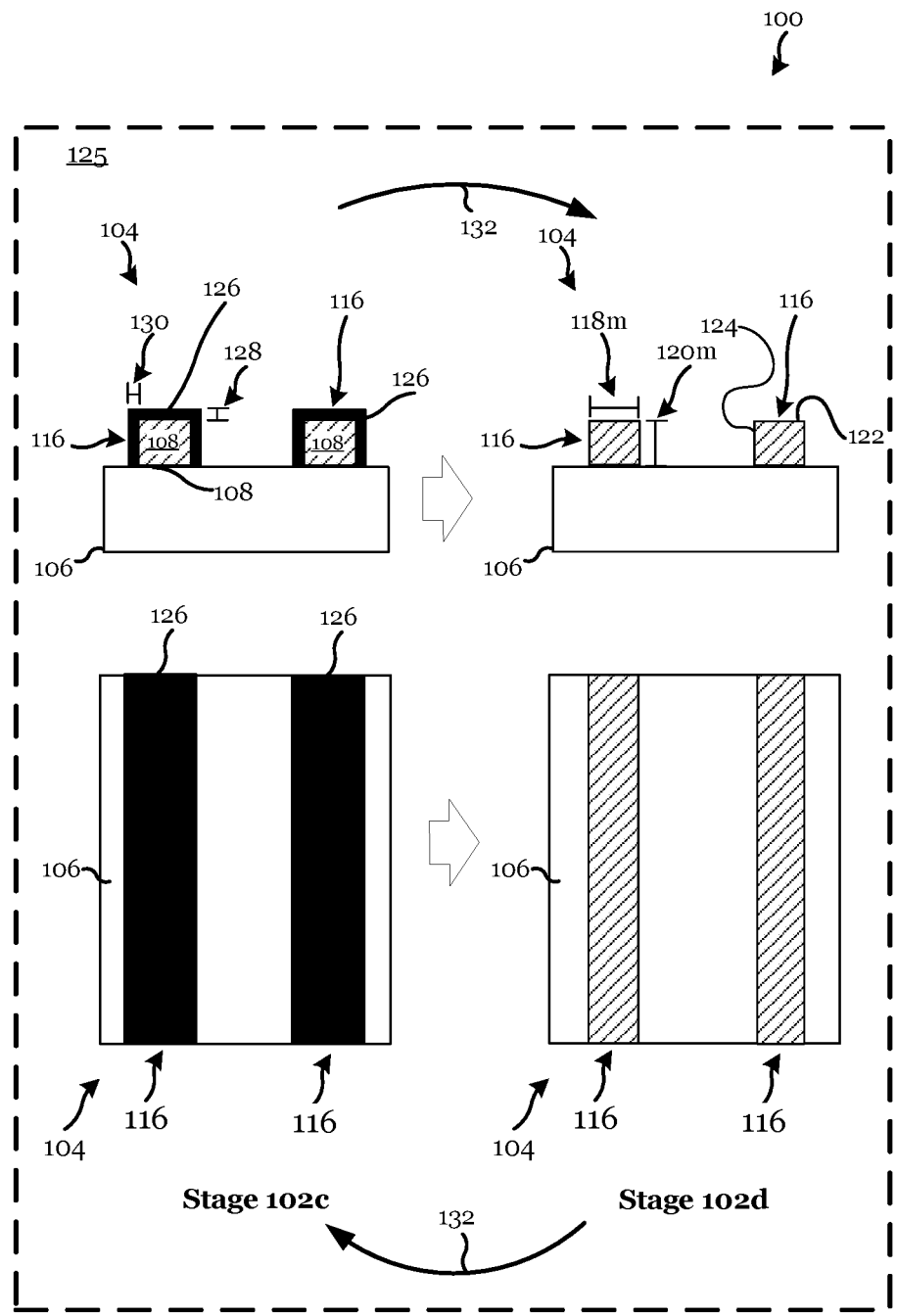
Figure 1C:
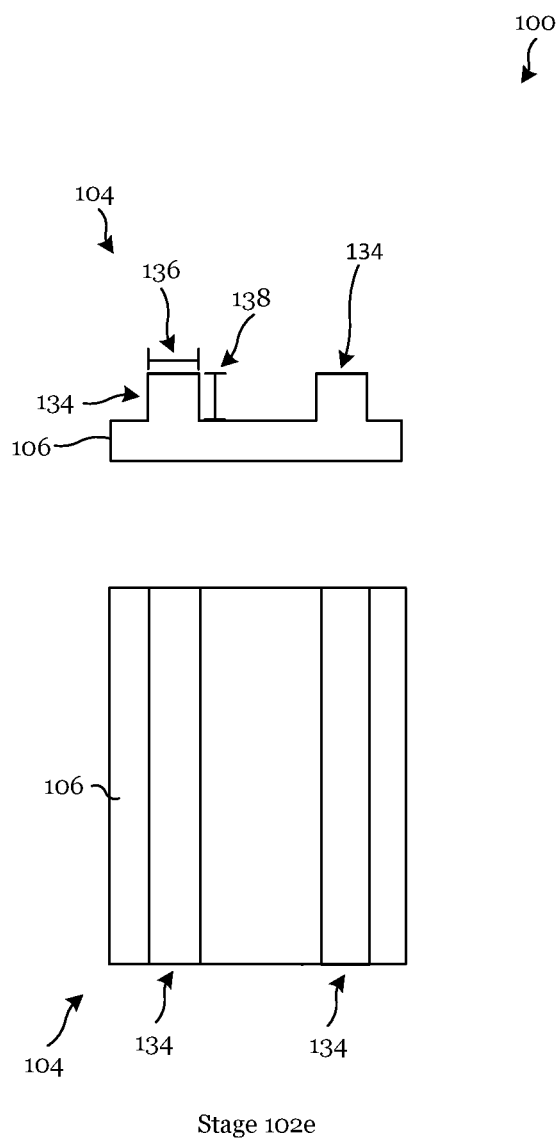

FIGS. 1A-1C illustrate cross-sectional views and corresponding top views of a process 100 for forming a semiconductor device, according to certain embodiments of this disclosure. In the illustrated example, process 100 includes stages 102a-102e of formation of a semiconductor device 104. FIG. 1A illustrates stages 102a and 102b, FIG. 1B illustrates stages 102c and 102d, and FIG. 1C illustrates stage 102e. Semiconductor device 104 also may be referred to as a semiconductor wafer or just wafer.

At stage 102a, semiconductor device 104 includes a substrate 106, a hard mask layer 108 deposited above substrate 106, intermediate layers 110 and 112 deposited above hard mask layer 108, and a patterned resist layer 114 formed above intermediate layers 110 and 112 and over hard mask layer 108.

Substrate 106 may include silicon, silicon germanium, silicon carbide, compound semiconductors (e.g., gallium nitride, gallium arsenide, indium arsenide, indium phosphide, and others), or combinations of these materials. This disclosure contemplates substrate 106 including any suitable material. Substrate 106 may include a semiconductor wafer that may include a semiconductor epitaxial layer including hetero epitaxial layers. As an example, one or more hetero epitaxial layers that include a compound semiconductor may be formed over substrate 106. In certain embodiments, a portion or the entirety of substrate 106 may be amorphous, polycrystalline, or single-crystalline. Substrate 106 may be doped, undoped, or contain both doped and undoped regions. In certain embodiments, substrate 106 may already include previously patterned layers and the dielectric stack of hard mask layer 108.

Hard mask layer 108 is a layer that is to be patterned into one or more features, as described further below. Hard mask layer 108 may include a stack of films. As just a few examples, hard mask layer 108 may include films of dielectric and/or conductive materials, such as silicon oxide, silicon nitride, silicon oxynitride, silicon carbide, titanium nitride, tantalum nitride, their alloys, and combinations thereof. In certain embodiments, hard mask layer 108 may be a sacrificial layer that is removed after being used as a hard mask in a subsequent etch step (e.g., as described with respect to FIG. 1C, stage 102e). Hard mask layer 108 may include, for example, an inter-metal dielectric (IMD) that includes a low-k dielectric material, and substrate 106 may include multiple interconnect levels that include dielectric films with embedded conductive interconnect elements formed over a single crystal bulk semiconductor or semiconductor-on-insulator (SOI) wafer in which various active devices may be fabricated.

Hard mask layer 108 may be deposited using any technique appropriate for the material to be deposited. This can include, for example, atomic layer deposition (ALD), chemical vapor deposition (CVD), low-pressure CVD (LPCVD), PECVD, semi-atmosphere CVD (SACVD), high density plasma CVD (HDPCVD), rapid thermal CVD (RT-CVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, PVD, chemical oxidation, molecular beam epitaxy (MBE), plating, and/or evaporation.

In the illustrated example, semiconductor device 104 includes intermediate layers 110 and 112. Intermediate layer 110 may be a spin-on-carbon layer and/or an amorphous carbon layer. Intermediate layer 112 may be a silicon-on-glass (SOG) layer and/or an anti-reflective coating (ARC). Although these particular intermediate layers are illustrated and described, this disclosure contemplates semiconductor device 104 omitting intermediate layers or including different intermediate layers (with or without intermediate layer 110 and/or intermediate layer 112).

Patterned resist layer 114 may be a photoresist layer and patterned to facilitate formation of respective features from hard mask layer 108 (e.g., features 116, described below). For example, patterned resist layer 114 may serve as an etch mask when forming features from hard mask layer 108. In other words, features of patterned resist layer 114 may cause corresponding features of hard mask layer 108 to remain during a subsequent etch process, as described below.

In certain embodiments, patterned resist layer 114 is formed using an EUV lithography process or electron beam (e-beam) lithography process. In one example, patterned resist layer 114 is formed by depositing or coating a blanket layer of EUV-sensitive photoresist film onto a layer, such as intermediate layer 112. As a particular example, the EUV-sensitive photoresist film may be an organic photoresist film or a metal oxide photoresist film sensitive to EUV radiation in the wavelength range of 10 nm to about 14 nm, typically 13.5 nm. These values are provided for example purposes only.

The blanket layer of EUV-sensitive photoresist film may be deposited to a desired height/thickness. For example, the height of the EUV-sensitive photoresist film may be about 10 nm to about 30 nm, and about 25 nm in a particular example. Again, these values are provided for example purposes only. The height of the EUV-sensitive photoresist film may be constrained by the properties of the radiation being used for developing and its interaction with the EUV-sensitive photoresist film.

The blanket layer of EUV-sensitive photoresist film is then patterned through EUV lithographic patterning techniques to form patterned resist layer 114 that includes one or more features. The features patterned in the EUV-sensitive photoresist film may have a desired critical dimension or width for that layer (patterned resist layer 114). As a particular example, the width may be about 5 nm to about 30 nm, and about 20 nm in a particular embodiment. As another particular example, the width may be about 5 nm to about 15 nm, and about 10 nm in a particular embodiment. These values are provided for example purposes only. The width may be the critical dimension achievable for the EUV-sensitive photoresist film by the lithography system after developing.

In the above example, patterned resist layer 114 was described as being formed in a lithographic step of a multiple patterning technique. In other examples, patterned resist layer 114 may be formed as a subsequent intermediate feature (e.g., formed as a consequence of pitch doubling). However, in certain embodiments, patterned resist layer 114 includes features that have a critical dimension of the minimum feature size that is obtainable with (directly or indirectly) a lithographic process using EUV lithography or e-beam lithography.

As described above, the EUV or other lithographic process used to form patterned resist layer 114 may leave features of patterned resist layer 114 with pattern defects, such as surface roughness (e.g., line edge roughness and/or line width roughness). The chemistries and processes associated with photolithography techniques (e.g., EUV lithography) for patterning features contribute to pattern defects, such as line edge roughness and inadequate critical dimension control.

Turning to stage 102b, hard mask layer 108 is patterned using patterned resist layer 114 as an etch mask. In certain embodiments, patterning hard mask layer 108 includes performing an etch process to remove patterned resist layer 114 and intermediate layers 110 and 112 between patterned resist layer 114 and hard mask layer 108. That is, at stage 102b, an etch process has been performed on the semiconductor device 104 of stage 102a, to pattern hard mask layer 108. The etch process may include one or multiple etch steps. In a particular example, the etch process is a plasma etch process, although this disclosure contemplates using any suitable etching process for patterning hard mask layer 108. For example, this disclosure contemplates using a wet etch process or a dry etch process to pattern hard mask layer 108.

The etch process of stage 102b patterns one or more features 116 from hard mask layer 108. At stage 102b, features 116 of hard mask layer 108 have dimensions, including a width 118, which may be referred to as a lateral dimension, and a height 120, which may be referred to as a vertical dimension. Additionally, features 116 have multiple surfaces, including top surface 122 and side surfaces 124. Although features 116 are shown as having particular shapes, this disclosure contemplates features 116 having other suitable shapes, including a variety of shapes within hard mask layer 108, if desired.

After the etch process of stage 102b, the pattern defects present in patterned resist layer 114 may be propagated to features 116 of hard mask layer 108. As described above, the typical etching techniques used to form features 116 in hard mask layer 108 may leave features 116 of hard mask layer 108 with pattern defects, such as surface roughness (e.g., line edge roughness and/or line width roughness). The chemistries and processes associated with typical etching techniques (e.g., plasma etching) for patterning features 116 contribute to pattern defects, such as line edge roughness and inadequate critical dimension control. For example, a typical plasma etch process for etching one or more layers to form features 116 in hard mask layer 108 using patterned resist layer 114 (with its pattern defects) as an etch mask may inadequately reduce the pattern defects in features 116 of hard mask layer 108, fail to improve the pattern defects at all, and in some cases even may exacerbate the pattern defects. These plasma etch processes generally involve multiple reactions occurring simultaneously (e.g., within a plasma process chamber), which further contribute to pattern defects, such as line edge roughness.

Thus, after performing the etch process (e.g., a plasma etch) to form semiconductor device 104 as it exists at stage 102b, surfaces (e.g., one or more of top surface 122 and side surfaces 124) of features 116 formed in hard mask layer 108 may include a unsatisfactory amount of roughness, which may include one or more of surface roughness or edge roughness. In other words, in a particular example in which a plasma etch process is used to pattern hard mask layer 108, that plasma etch process may leave features 116 of hard mask layer with an unsatisfactory amount of roughness. Furthermore, the plasma etch process (or other suitable etch process used to pattern hard mask layer 108) may have an insufficient amount of control of one or more critical dimensions of features 116 patterned from hard mask layer 108. In other words, again considering a particular example in which a plasma etch process is used to pattern hard mask layer 108, that plasma etch process might provide an inadequate ability to control one or more critical dimensions (e.g., width 118 and/or height 120) of features 116 patterned from hard mask layer 108.

Embodiments of this disclosure use an atomic layer etch process 125 (described with FIG. 1B) to further process features 116. In a conventional process, no such atomic layer etch is performed. In various embodiments, an atomic layer etch process is incorporated, for example, in the same plasma chamber used for the plasma etching that formed the patterned hard mask layer 108. In such embodiments, the plasma processing chamber is purged to remove all the previously used gas chemistries.

In contrast to a typical plasma (or other) etch process, in certain embodiments, atomic layer etch process 125 includes two primary steps, as shown at stages 102c and 102d (illustrated in FIG. 1B). A first step, as shown at stage 102c for example, is a surface modification step in which a surface layer is formed by converting a portion of hard mask layer 108 (e.g., a portion of features 116 of hard mask layer 108), and a second step, as shown stage 102d for example, is a layer activation step in which the surface layer is removed. In certain embodiments, atomic layer etch process 125 is an isotropic process; however, this disclosure contemplates using an anisotropic atomic layer etch process 125.

At stage 120c, in the first atomic layer etch step, a layer 126 is formed by converting a portion of hard mask layer 108. That is, layer 126 is formed by converting portions of features 116 of hard mask layer 108 remaining after stage 102b. The portion of hard mask layer 108 that is converted may be a relatively thin surface layer of features 116 of hard mask layer 108. For example, the first atomic layer etch step is capable of converting a portion of features 116 of hard mask layer 108 as thin as a monolayer. In a particular example, hard mask layer 108 may include silicon, and the first atomic layer etch step may convert a thin surface layer of the silicon-based hard mask layer 108 to silicon dioxide, such that layer 126 includes silicon dioxide. Layer 126 also may be referred to as a modified layer.

In a particular example, the first atomic layer etch step is a plasma process that converts a portion of hard mask layer 108 to layer 126. In certain embodiments, the plasma process for converting a portion of hard mask layer 108 to layer 126 is a plasma oxidation process, a plasma nitridation process, or any other suitable type of plasma process. The plasma process (e.g., the plasma oxidation process) may provide a high measure of control over the thickness and content of layer 126, which ultimately provides heightened control over the resulting dimensions of features 116 that remain after atomic layer etch process 125.

The reasons for the advantages provided by the first atomic layer etch step and the second atomic layer etch will be discussed in further details using FIG. 7B-7C.

The ability to convert layers as precise as monolayers for conversion to a material that is then selectively targeted for etching in a second atomic layer etch process provides enhanced control over which portions of features 116 ultimately are etched, which facilitates smoothing surfaces of features 116 and provides greater control over the dimensions of features 116.

Although this disclosure primarily describes using a plasma process to form layer 126, this disclosure contemplates any suitable process for forming layer 126. For example, a thermal oxidation process or a wet deposition process may be used to form layer 126 by converting a portion of hard mask layer 108 to layer 126 (e.g., to convert a surface layer of features 116 of hard mask layer 108 to layer 126).

In certain embodiments, layer 126 has a faster removal rate than the unconverted material of hard mask layer 108 using the second atomic layer etch step, described below. This characteristic of layer 126 also may contribute to the heightened control over the resulting dimensions of features 116 that remain after atomic layer etch process 125.

The process used to form layer 126 may be an isotropic process or an anisotropic process, according to particular implementation objectives. An isotropic process, such as an isotropic plasma process, may result in formation of a layer 126 that has a generally uniform (though not necessarily identical) thickness. That is a thickness 128 of layer 126 along the tops of features 116 may be substantially equal to a thickness 130 of layer 126 along the sidewalls of features 116. As will be described in greater detail below with reference to FIGS. 2A-2B, an anisotropic process, such as an anisotropic plasma process, may be used to form a layer 126 that varies in thickness.

Because the first atomic layer etch step converts a portion of hard mask layer 108 (e.g., surface portions of features 116 of hard mask layer 108) to layer 126, the unconverted portions of features 116 may have different dimensions than those of features 116 formed at stage 102b. Furthermore, as described in greater detail below, the thickness of layer 126 (e.g., thicknesses 128 and 130) impacts the dimensions of features 116 resulting from atomic layer etch process 125. In embodiments in which layer 126 is formed using a plasma process, for example, the thickness (and make-up) of layer 126 can be controlled by modifying the plasma parameters.

At stage 120d, in the second atomic layer etch step, layer 126 is selectively removed from hard mask layer 108. In various embodiments, the second atomic layer etch step is designed to be selective so that it advantageously removes the layer 126 without removing the hard mask layer 108. Thus, the second atomic layer etch step is designed to self-terminate once the layer 126 is removed from the hard mask layer 108 in some embodiments. The process of removing layer 126 also may be referred to as activation of features 116/hard mask layer 108.

This disclosure contemplates any suitable process for removing layer 126, including both wet and dry processes. In certain embodiments, a wet strip process is used to remove layer 126 from features 116 of hard mask layer 108. This wet strip process may target layer 126. For example, as discussed above, the material of layer 126 may have a faster etch rate when the wet strip process is used than the unconverted material of features 116 of hard mask layer 108 (if the material of hard mask layer were to be exposed to the wet strip process). This mismatched etch rate characteristic of layer 126 and hard mask layer 108 facilitates the removal process of the second atomic layer etch step of atomic layer etch process 125 removing layer 126 and removing little or no material of unconverted portions of features 116 of hard mask layer 108.

Because the first atomic layer etch step of atomic layer etch process 125 converts a portion of hard mask layer 108 (e.g., surface portions of features 116 of hard mask layer 108) to layer 126, the unconverted portions of features 116 may have different dimensions than those of features 116 formed at stage 102b. For example, following removal of layer 126 at stage 102d, features 116 of hard mask layer 108 may have width 118m and height 120m (the "m" representing that these dimensions of features 116 have been modified), which are less than width 118 and height 120 of features 116 at stage 102b.

The thickness of layer 126 (e.g., thicknesses 128 and 130) impacts the dimensions of features 116 resulting from atomic layer etch process 125. As a result, dimensions (e.g., width 118m and height 120m) of features 116 at stage 102d may be controlled by manipulating the thickness of layer 126. A thicker layer 126 results in a greater reduction in one or more dimensions of features 116 from stage 102b to stage 102d. In embodiments in which layer 126 is formed using a plasma process, for example, the thickness (and make-up) of layer 126 can be controlled by modifying the plasma parameters. Additionally, as described above, because layer 126 can be as thin as a monolayer, the second step of the atomic layer etch process (and thereby the overall atomic layer etch process) is able to remove precise portions of features 116.

In certain embodiments, the first and second atomic layer etch steps (e.g., stages 102c and 102d) of atomic layer etch process 125 may be any combination of dry and wet processes. Particular example process conditions for an example atomic layer etch process 125 are described below. In this example, both the first and second atomic layer etch steps (e.g., stages 102c and 102d) of atomic layer etch process 125 are dry processes. These process conditions are provided for example purposes only. This disclosure contemplates using any suitable process conditions for forming and removing layer 126, according to particular implementation objectives.

In certain embodiments, the first atomic layer etch step (layer 126 formation) and the second atomic layer etch step (layer 126 removal) of atomic layer etch process 125 may be executed in a same plasma process chamber of a plasma process system. A purge of the gases within the plasma process chamber might or might not be performed between the first atomic layer etch step and the second atomic layer etch step of the atomic layer etch process, depending on implementation details. Purging the plasma process chamber between the first and second atomic layer etch steps may reduce the opportunity for conversion gases (e.g., those used in the first atomic layer etch step) to remain in the plasma process chamber during the removal step (e.g., the second atomic layer etch step) and interfere with the removal step. Performing a purge between the second and first atomic layer etch steps (e.g., when starting a new cycle of atomic layer etch process 125) may reduce the opportunity for removal gases (e.g., those used in the second atomic layer etch step) to remain in the plasma process chamber during the conversion step (e.g., the first atomic layer etch step) and interfere with the conversion step.

Table 1 below provides example dry process conditions of a first atomic layer etch step of atomic layer etch process 125 according to certain embodiments.

TABLE 1

Process Conditions of Modified Layer Formation

| PROCESS CONDITION | SETTING |
| --- | --- |
| Pressure | 10 mT to 500 mT |
| Source Radio Frequency (RF) Power | 0 W to 1000 W |
| Bias RF Power | 0 W to 100 W |
| Temperature | −10° C. to 130° C. |
| O2 | 0 sccm to 500 sccm |
| N2 | 0 sccm to 500 sccm |
| He | 0 sccm to 2000 sccm |
| Ar | 0 sccm to 2000 sccm |
| CH4 | 0 sccm to 100 sccm |
| H2 | 0 sccm to 500 sccm |
| CO2 | 0 sccm to 500 sccm |
| CO | 0 sccm to 500 sccm |
| NO | 0 sccm to 500 sccm |
| SO2 | 0 sccm to 500 sccm |

In one particular example of the first atomic layer etch step to form layer 126 of features 116 of hard mask layer 108, process parameters may include: pressure of about 20 mT to about 100 mT; an RF source power of about 200 W to about 600 W; no RF bias power; temperature of about 20° C. to about 60° C.; O2 flow rate of about 200 sccm to about 350 sccm; N2 flow rate of about 0 sccm to about 350 sccm.

Table 2 below provides example dry process conditions of a second atomic layer etch step of atomic layer etch process 125 according to certain embodiments.

TABLE 2

Process Conditions of Modified Layer Removal

| PROCESS CONDITION | SETTING |
| --- | --- |
| Pressure | 10 mT to 500 mT |
| Source RF Power | 0 W to 1000 W |
| Bias RF Power | 0 W to 100 W |
| Temperature | −10° C. to 130° C. |
| O2 | 0 sccm to 500 sccm |
| N2 | 0 sccm to 500 sccm |
| He | 0 sccm to 2000 sccm |
| Ar | 0 sccm to 2000 sccm |
| CH4 | 0 sccm to 100 sccm |
| H2 | 0 sccm to 500 sccm |
| CO2 | 0 sccm to 500 sccm |
| CO | 0 sccm to 500 sccm |

TABLE 2-continued

Process Conditions of Modified Layer Removal

| PROCESS CONDITION | SETTING |
|---|---|
| NO | 0 sccm to 500 sccm |
| SO2 | 0 sccm to 500 sccm |
| CxFy | 0 sccm to 500 sccm |
| CHxFy | 0 sccm to 500 sccm |
| Cl2 | 0 sccm to 500 sccm |
| BCl3 | 0 sccm to 500 sccm |
| SF6 | 0 sccm to 500 sccm |
| NF3 | 0 sccm to 500 sccm |

In one particular example of the second atomic layer etch step to remove layer 126 of features 116 of hard mask layer 108, process parameters may include: pressure of about 40 mT to about 150 mT; an RF source power of about 200 W to about 600 W; an RF bias power of 0 W to about 100 W; temperature of about 20° C. to about 130° C.; NF3 flow rate of about 0 sccm to about 200 sccm; SF6 flow rate of about 0 sccm to about 200 sccm; CF4 flow rate of about 0 sccm to about 200 sccm, He flow rate of about 0 sccm to about 500 sccm (for dilution), and no O2 or N2.

In another example, the first atomic layer etch step (layer 126 formation) of atomic layer etch process 125 is a dry process (e.g., according to the process conditions shown in Table 1), and the second atomic layer etch step (layer 126 removal) of atomic layer etch process 125 is a wet process. As just one particular example, the wet process conditions for the second atomic layer etch step (layer 126 removal) may include processing semiconductor device 104 resulting from stage 102c with phosphoric acid (H3PO4) and a hydrogen fluoride (HF)-based chemical. As just a few examples, the HF-based chemical may include dilute HF, buffered HF, and/or HF with an organic solvent, such as polycarbonate, ethylene glycol, etc.

In certain embodiments of this processing scenario (a dry deposition process as a first atomic layer etch step followed by a wet etch process as a second atomic layer etch step), a purge of the plasma process chamber of the plasma process system might not be performed between the first atomic layer etch step and the second atomic layer etch step of the atomic layer etch process; however, this disclosure contemplates purging the plasma process chamber, if appropriate.

In certain embodiments, as shown by arrows 132, the steps of atomic layer etch process 125 (e.g., the first atomic layer etch step, or surface conversion/layer 126 formation step, and the second atomic layer etch step, or modified layer 126 removal step) may be repeated one or more times, in a cyclic fashion for example. It should be understood that this disclosure contemplates performing atomic layer etch process 125 any suitable number times, including one or more than one.

In certain embodiments, each cycle through atomic layer etch process 125 is capable of removing a layer as small as a monolayer, if desired and under the right conditions. The appropriate number of cycles for performing atomic layer etch process 125 for a given implementation depends on a variety of factors, including the material of hard mask layer 108; the desired critical dimension of features 116; the acceptable amount of surface roughness (e.g., line edge roughness and/or line width roughness) of features 116; the acceptable amount of time that the atomic layer etch process may introduce to the entire process of fabricating semiconductor device 104; the substance(s) (e.g., gas(es)) used as part of atomic layer etch process 125, including the substance(s) used to convert a portion of feature 116 of hard mask layer 108 to layer 126 and the substance(s) used to remove layer 126; and/or other suitable factors.

In certain embodiments, the appropriate number of cycles for performing atomic layer etch process 125 is predetermined (prior to production fabrication runs) by processing test wafers. A wafer (e.g., semiconductor device 104) may be sampled at a variety of stages to measure aspects of the wafer, including, if at the appropriate stage, features 116. For example, samples may be analyzed after one or more of stage 102a, stage 102b, one or more cycles of atomic layer etch process 125 (after stage 102d), and stage 102e.

As a more particular example, a first wafer may be sampled after a first predetermined number of cycles of atomic layer etch process 125, and the measurements of characteristics such as critical dimension and surface roughness may be compared to desired values for those characteristics, e.g., to a technology node parametric. A determination then may be made whether to test a new wafer after a second predetermined number of cycles that is either less than or greater than the first predetermined number of cycles, depending on the results of the comparison and other factors (e.g., such as any one of the other above-listed factors). This process of sampling may be repeated until a suitable number of cycles is determined for a given implementation. Furthermore, adjustments to the steps of atomic layer etch process 125 also may be determined as part of this testing and analysis. For example, different thicknesses of layer 126 (the modified surface layer of features 116 formed from the first step of atomic layer etch process 125) may be analyzed to determine the effect of the thickness of layer 126 on smoothing and critical dimensions of features 116.

The above-described technique for determining an appropriate number of cycles of atomic layer etch process 125 is provided as an example only. This disclosure contemplates any suitable technique for determining an appropriate number of cycles for performing atomic layer etch process 125.

Characteristics, such as critical dimensions and line edge/line width roughness, of lines (e.g., of a feature 116 of hard mask layer 108) of semiconductor device 104 may be measured using optical techniques such as scatterometry, a scanning electron microscope (SEM), transmission electron microscope (TEM), high-resolution TEM (HR-TEM), scanning probe microscope (SPM), atomic force microscope (AFM), scanning tunneling microscope (STM), or other suitable device.

Roughness may be measured using a root mean square metric over a given length of feature 116 (e.g., over a given line-length). This disclosure, however, contemplates using any suitable technique/metric for measuring roughness, such as an amplitude density function.

Whether repeated or not, the formation of layer 126 in a single iteration or across multiple iterations of the atomic layer etch process may include an isotropic deposition process, an anisotropic deposition process, or a combination thereof.

In certain embodiments, atomic layer etch process 125 provides enhanced control over critical dimensions of features 116 of hard mask layer 108. For example, a cycle of atomic layer etch process 125 results in a semiconductor device 104 at stage 102d with features 116 that have a reduced width 118m and height 120m relative to the width 118 and height 120 of features 116 of semiconductor device 104 at stage 102b. As another example, as described further in connection with FIGS. 2A-2B, a cycle of atomic layer etch process 125 may result in a reshaping of features 116 of semiconductor device 104, such as by reducing a dimension of features 116 by a different amount than another dimension of feature 116. According to certain embodiments, an appropriate number of cycles may be performed until features 116 have desired dimensions (e.g., width 118$m$ and height 120$m$). Furthermore, the ability to control the thickness of layer 126 and the selective removal of layer 126 may improve the ability to control one or more critical dimensions of features 116 patterned from hard mask layer 108. In certain embodiments, atomic layer etch process 125 provides nanometer-level control of dimensions of features 116 of hard mask layer 108.

In certain embodiments, atomic layer etch process 125 provides a smoothing capability, such that one or more iterations of atomic layer etch process 125 may reduce or eliminate roughness along the surfaces (e.g., top surface 122$m$ and side surfaces 124$m$) of features 116 of hard mask layer 108. Thus, in certain embodiments, surface and/or edge roughness of features 116 of hard mask layer 108 may be reduced or eliminated. An example of smoothing of surfaces of a feature 116 of hard mask layer 108 is illustrated in and described below with reference to FIGS. 7A-7C.

Therefore, embodiments of process 100 provide simultaneous critical dimension control and roughness improvement of patterned hard mask layer 108 (e.g., features 116 of hard mask layer 108).

In certain embodiments, in a fifth stage, stage 102$e$ as shown in FIG. 1C, features 116 of hard mask layer 108 are used as an etch mask to form features 134 in substrate 106. Substrate 106 and features 116 of hard mask layer 108 may be etched using any suitable process. For example, substrate 106 and features 116 of hard mask layer 108 may be etched using a dry etch process, such as a plasma etching process. As another example, substrate 106 and features 116 of hard mask layer 108 may be etched using a wet etch process. This disclosure contemplates any suitable technique for etching substrate 106 and features 116 of hard mask layer 108. Furthermore, etching the substrate 106 and features 116 of hard mask layer 108 may include any suitable number and combination of deposition and etching steps.

Features 134 of substrate 106 resulting from the etching of substrate 106 and features 116 of hard mask layer 108 generally correspond to features 116 of hard mask layer 108. That is, hard mask layer 108 serves as an etch mask for etching substrate 106, such that features are formed in substrate 106 (features 134) that correspond to features 116 of hard mask layer 108. The potentially improved surface roughness (e.g., the smoothing) of surfaces of features 116 of hard mask layer 108 and the potentially improved maintenance of one or more critical dimensions of features 116 of hard mask layer 108 may facilitate improving the roughness (e.g., the smoothing) and critical dimension(s) of features 134 resulting from etching, using hard mask layer 108 (with features 116) as an etch mask. In other words, in certain embodiments, because features 116 of hard mask layer 108 have reduced surface roughness (e.g., are smoother) and/or have more precise dimensions, those improvements may be propagated to features 134 formed in substrate 106.

Although throughout FIGS. 1A-1C (and other portions of this disclosure) semiconductor device 104 is shown and described as having particular layers of particular materials, this disclosure contemplates semiconductor device 104 having other suitable layers of other materials. Furthermore, although semiconductor device 104 is shown and described as having a particular number of layers, this disclosure contemplates semiconductor device 104 having any suitable number of layers.

Additionally, although process 100 is shown as including five stages 102$a$, 102$b$, 102$c$, 102$d$, and 102$e$, this disclosure contemplates process 100 including additional or fewer stages as might be appropriate for a particular implementation. For example, process 100 might include additional stages between stages that are illustrated in FIGS. 1A-1C, including, for example, purge stages between stages 102$c$ and 102$d$ and between stages 102$d$ and a return to 102$c$.

Furthermore, although features 116 are primarily described as being lines, both with respect to FIG. 1 and the other figures of this disclosure, it will be appreciated that features 116 may include any suitable features that might be formed in a semiconductor layer, including lines, holes, trenches, vias, and/or other suitable structures.

Figure 2A:
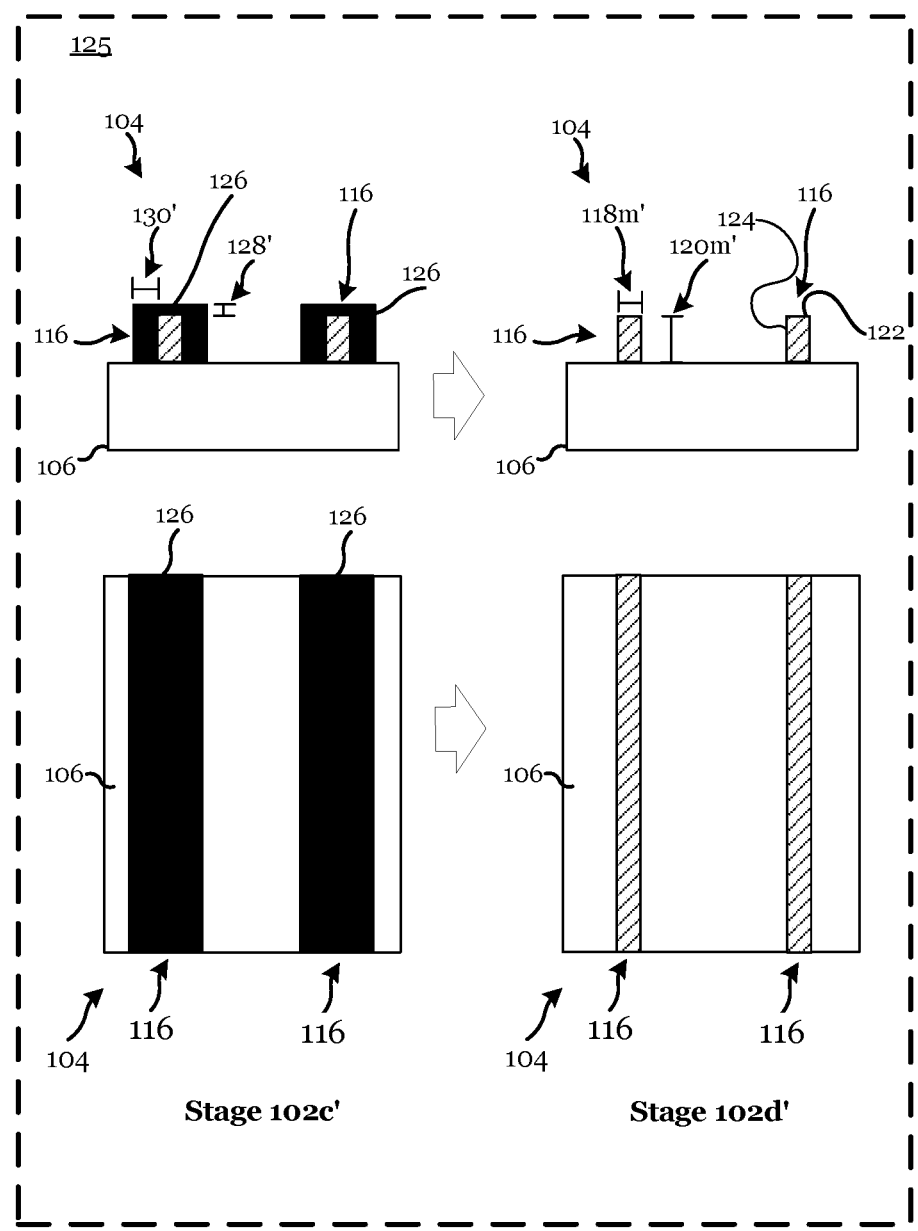
FIGS. 2A-2B illustrate example variations on the atomic layer etch process portion of the process illustrated in FIGS. 1A-1C, according to certain embodiments of this disclosure.
Figure 2B:
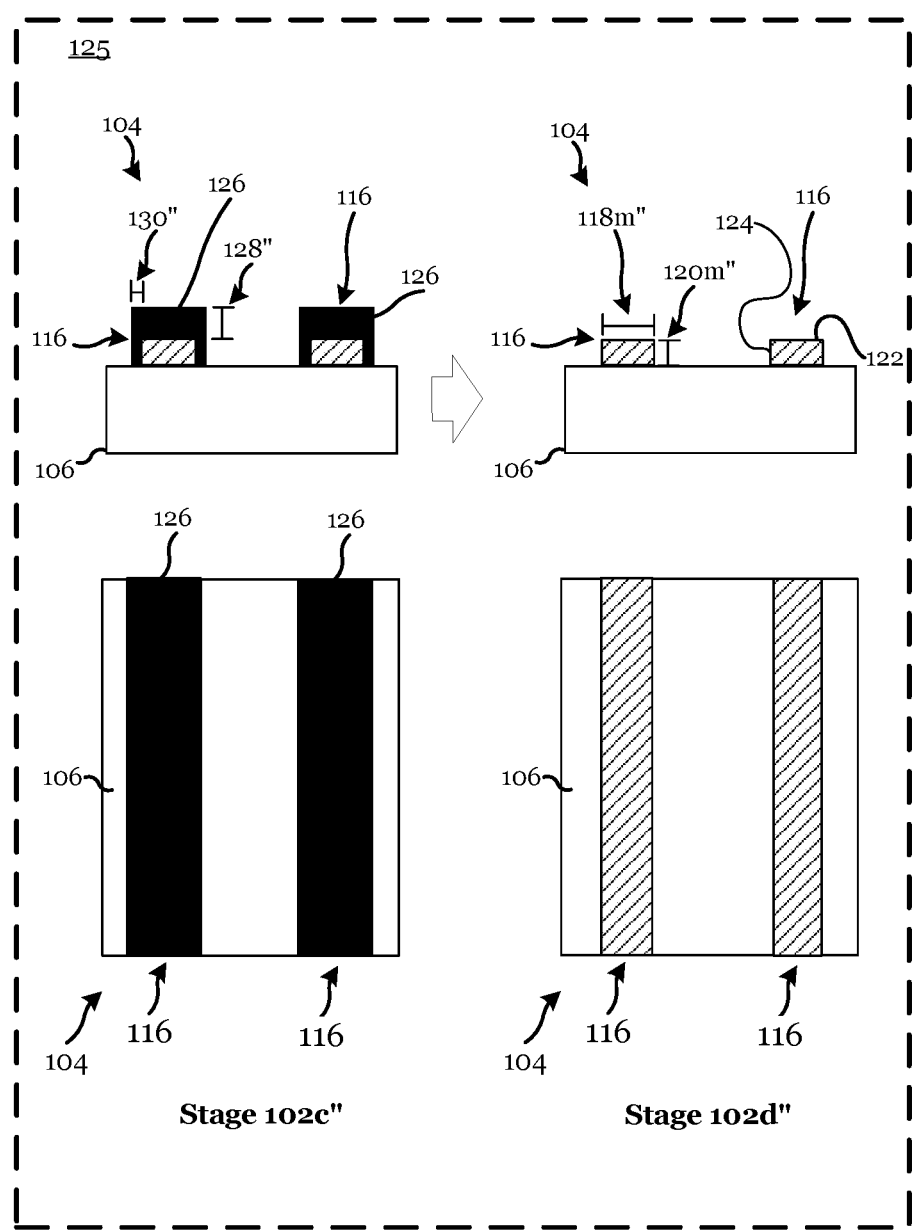

FIGS. 2A-2B illustrate example variations on atomic layer etch process 125 portion of process 100 illustrated in FIGS. 1A-1C, according to certain embodiments of this disclosure. In particular, FIGS. 2A-2B illustrate an example process for varying dimensions of features 116 of hard mask layer 108 using the atomic layer etch process 125 portion of process 100. In certain embodiments, variations in dimensions of features 116 of hard mask layer 108 may be accomplished by varying the thickness of layer 126 along different dimensions of hard mask layer 108 (e.g., along different dimensions of features 116 of hard mask layer 108).

FIG. 2A, for example, illustrates stages 102$c'$ and 102$d'$, which correspond to stages 102$c$ and 102$d$ of FIG. 1B. At stage 102$c'$, layer 126 is formed to a first thickness 128' along a first dimension of features 116 and to a second thickness 130' along a second dimension of features 116. In this example, second thickness 130' is greater than first thickness 128'. As shown, larger portions of features 116 of hard mask layer 108 in a lateral direction have been converted to layer 126 than in a vertical direction. As a result, after removal of layer 126 at stage 102$d'$, features 116 have decreased in size by a larger amount in a lateral dimension (width 118$m'$) than in a vertical direction (height 120$m'$). Thus, in this example, a lateral critical dimension of features 116 may be targeted for greater reduction than a vertical critical dimension of features 116.

FIG. 2B, as another example, illustrates stages 102$c''$ and 102$d''$, which correspond to stages 102$c$ and 102$d$ of FIG. 1B. At stage 102$c''$, first layer 126 is formed to a first thickness 128" along a first dimension of features 116 and to a second thickness 130" along a second dimension of features 116. In this example, first thickness 128" is greater than second thickness 130". As shown, larger portions of features 116 of hard mask layer 108 in a vertical direction have been converted to layer 126 than in a lateral direction. As a result, after removal of layer 126 at stage 102$d''$, features 116 have decreased in size by a larger amount in a vertical dimension (height 120$m''$) than in a lateral direction (width 118$m''$). Thus, in this example, a vertical critical dimension of features 116 may be targeted for greater reduction than a lateral critical dimension of features 116.

Thus, embodiments of this disclosure allow features 116 to be re-shaped, and for particular dimensions of features 116 to be target for greater or less reduction than other dimensions.

Variations in thickness of layer 126 can be achieved using an anisotropic process, such as an anisotropic deposition process. In certain embodiments, an adjustment to one or more process conditions of atomic layer etch process 125 may be made to facilitate targeting particular dimensions of features 116 for greater reduction. As just one example with reference to the example dry process described above with reference to Table 1, the bias RF parameter of the processing conditions may be adjusted to facilitate targeting particular dimensions of features 116 for greater reduction. As a particular example, to achieve the relatively larger lateral reduction of features 116 shown in FIG. 2A, the bias RF may be set as shown in Table 1 (0 W). As another particular example, to achieve the relatively larger vertical reduction of features 116 shown in FIG. 2B, the bias RF may be set in the range of 0 W to 500 W.

As discussed above with reference to FIG. 1C (at stage 102e), substrate 106 may be etched using hard mask layer 108 (including features 116) as an etch mask, with hard mask layer 108 (including features 116) ultimately being removed as well, in one or more steps. Resulting features 134 of substrate 106 generally correspond to and have similar dimensions to features 116 of hard mask layer 108. For example, with respect to features 116 at stage 102d' in FIG. 2A, etched features 134 of substrate 106 may have dimensions that generally correspond to width 118m' and height 120m' of features 116. As another example, with respect to features 116 at stage 102d" in FIG. 2B, etched features 134 of substrate 106 may have dimensions that generally correspond to width 118m" and height 120m" of features 116.

Figure 3:
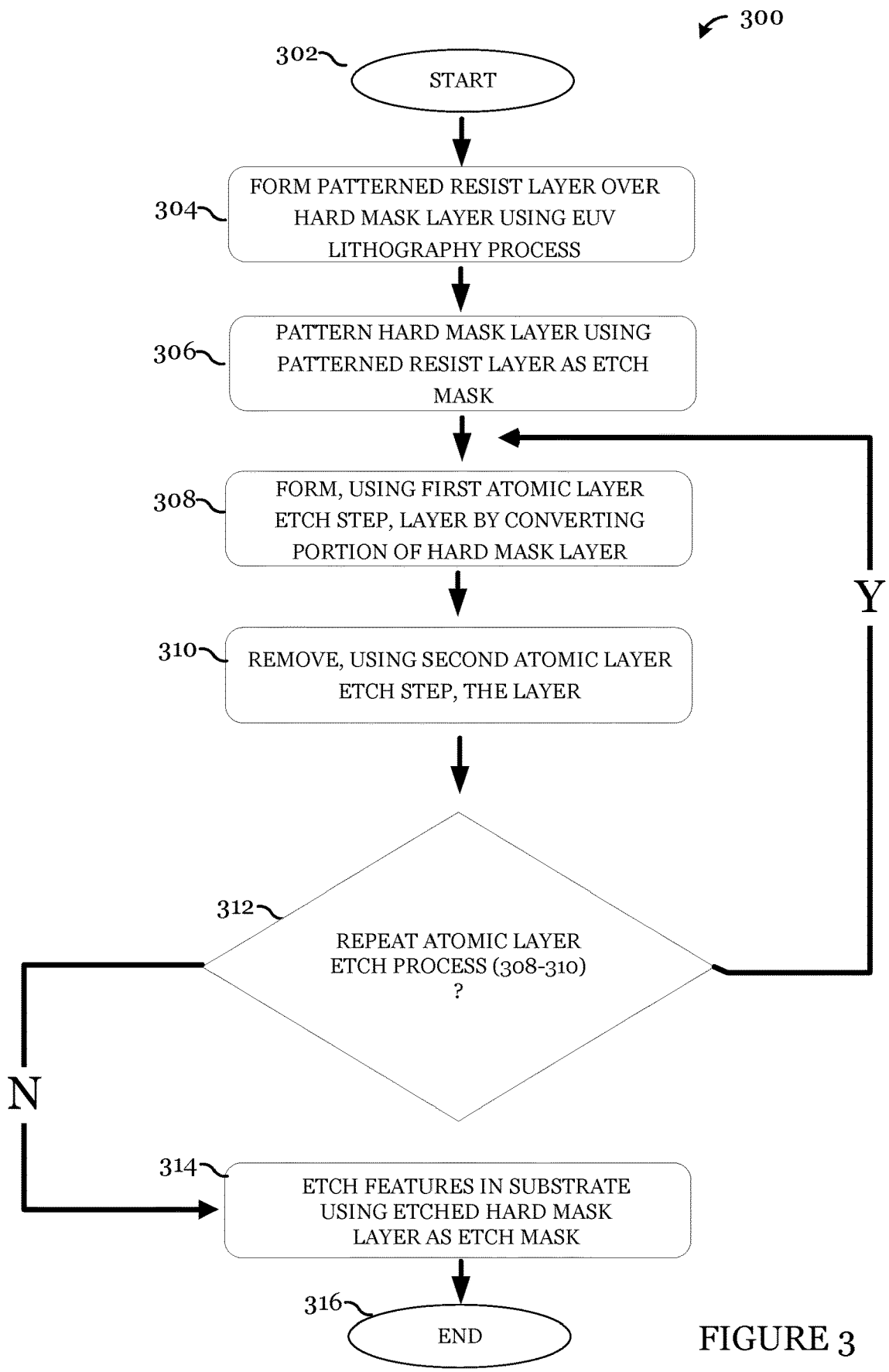
FIG. 3 illustrates an example method for forming a semiconductor device, according to certain embodiments of this disclosure.

FIG. 3 illustrates an example method 300 for forming a semiconductor device, according to certain embodiments of this disclosure. The method begins as step 302.

At step 304, patterned resist layer 114 is formed over hard mask layer 108 using an EUV lithography process. Hard mask layer 108 is formed over substrate 106. In certain embodiments, one or more intervening layers (e.g., intermediate layers 110 and 112) are formed between hard mask layer 108 and patterned resist layer 114.

At step 306, hard mask layer 108 is patterned using patterned resist layer 114 as an etch mask. In certain embodiments, patterning hard mask layer 108 includes performing a plasma etch (or other suitable etch process) to remove patterned resist layer 114 and, if applicable, one or more intervening layers (e.g., intermediate layers 110 and 112) between patterned resist layer 114 and hard mask layer 108. As a result of patterning hard mask layer 108, one or more features 116 may be formed from hard mask layer 108.

At step 308, using a first atomic layer etch step, a first layer 126 is formed by converting a first portion of hard mask layer 108. For example, first layer 126 may be formed by converting a surface layer of features 116 of hard mask layer 108. In certain embodiments, forming, using the first atomic layer etch step, first layer 126 includes performing a plasma process to convert the first portion of hard mask layer 108. As particular examples, the plasma process may be at least one of plasma oxidation or plasma nitridation, though, as described above, this disclosure contemplates a wide variety of processes for performing the first atomic layer etch step.

As described above, forming, using the first atomic layer etch step, first layer 126 by converting the first portion of the hard mask layer 108 may be an isotropic process, an anisotropic process, or a combination thereof. In certain embodiments, forming, using the first atomic layer etch step, first layer 126 by converting the first portion of hard mask layer 108 includes forming first layer 126 to a first thickness along a first dimension (e.g., a vertical or lateral dimension) of hard mask layer 108 and to a second thickness along a second dimension (the other of the vertical or lateral dimension) of hard mask layer 108. The first thickness may be the same as or different than the second thickness, according to particular objectives. In certain embodiments, forming first layer 126 to the first thickness along the first dimension of hard mask layer 108 and to the second thickness along the second dimension of hard mask layer 108 includes forming first layer 126 using an anisotropic process, such as an anisotropic plasma process.

In certain embodiments, after the first step of the atomic layer etch process of method 300 (step 308) and prior to the second step of the atomic layer etch process 125 (step 310), the plasma process chamber may be purged to remove remaining gases or other materials associated with the conversion step. Additionally or alternatively, in certain embodiments, after the second step of the atomic layer etch process of method 300 (step 310) and prior to a recurrence of the first step of the atomic layer etch process of method 300 (step 308), the plasma process chamber may be purged to remove remaining gases or other materials associated with removing layer 126.

At step 310, using a second atomic layer etch step, first layer 126 is removed. In certain embodiments, first layer 126 has a faster removal rate than hard mask layer 108 using the second atomic layer etch step. In certain embodiments, removing, using the second atomic layer etch step, first layer 126 includes performing a wet etch to remove first layer 126. Forming first layer 126 by converting the first portion of hard mask layer 108 and removing first layer 126 may modify a dimension of hard mask layer 108. For example, forming first layer 126 by converting the first portion of hard mask layer 108 and removing first layer 126 may modify a width 118 of features 116 of hard mask layer 108, a height 120 of features 116 of hard mask layer 108, a shape of features 116, or a combination thereof.

At step 312, a determination is made regarding whether to repeat atomic layer etch process 125. For example, a decision is made regarding whether to repeat steps 308 and 310.

If a determination is made to repeat atomic layer etch process 125 at step 312, then the method returns to step 308. In this example scenario, after forming first layer 126 (or subsequent if this is not the first repetition of steps 308 and 310) by converting the first portion (or subsequent if this is not the first repetition of steps 308 and 310) of hard mask layer 108 and removing first layer 126, method 300 includes forming, using the first atomic layer etch step, a second (or subsequent if this is not the first repetition of steps 308 and 310) layer 126 by converting a second portion of hard mask layer 108 at step 308 and removing, using the second atomic layer etch step, second (or subsequent if this is not the first repetition of steps 308 and 310) layer 126 at step 310.

If a determination is made not to repeat the atomic layer etch process at step 312, then method 300 proceeds to step 314. At step 314, substrate 106 is etched using etched hard mask layer 108 as an etch mask to form features 134 in substrate 106. Substrate 106 and features 116 of hard mask layer 108 may be etched using any suitable process. For example, substrate 106 and features 116 of hard mask layer 108 may be etched using a dry etch process, such as a plasma etch process. As another example, substrate 106 and features 116 of hard mask layer 108 may be etched using a wet etch process. This disclosure contemplates any suitable technique for etching substrate 106 and features 116 of hard mask layer 108. Furthermore, etching substrate 106 and features of hard mask layer 108 may include any suitable number and combination of deposition and etching steps.

Features 134 of substrate 106 resulting from the etching of substrate 106 and features 116 of hard mask layer 108 generally correspond to features 116 of hard mask layer 108. That is, hard mask layer 108 serves as an etch mask for etching substrate 106, such that features are formed in substrate 106 (features 134) that correspond to features 116 of hard mask layer 108. The potentially improved surface roughness (e.g., the smoothing) of surfaces of features 116 of hard mask layer 108 and the potentially improved maintenance of one or more critical dimensions of features 116 of hard mask layer 108 may facilitate improving the roughness (e.g., the smoothing) and critical dimension(s) of features 134 formed from etching, using hard mask layer 108 (with features 116) as an etch mask.

At step 316, method 300 ends.

Figure 4:
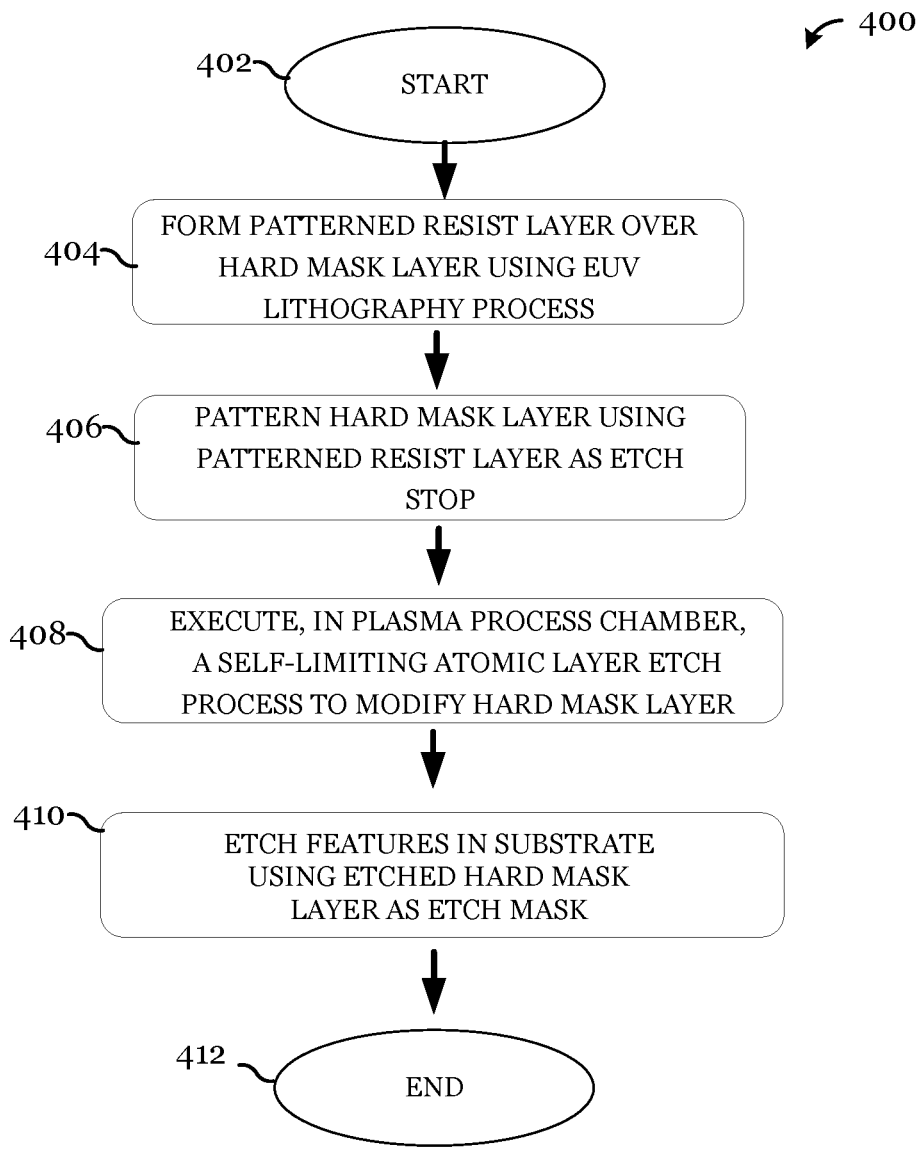
FIG. 4 illustrates an example method for forming a semiconductor device, according to certain embodiments of this disclosure.

FIG. 4 illustrates an example method 400 for forming a semiconductor device, according to certain embodiments of this disclosure. The method begins as step 402.

At step 404, patterned resist layer 114 is formed over hard mask layer 108 using an EUV lithography process. Hard mask layer 108 is formed over substrate 106. In certain embodiments, one or more intervening layers (e.g., intermediate layers 110 and 112) are formed between hard mask layer 108 and patterned resist layer 114.

At step 406, hard mask layer 108 is patterned using patterned resist layer 114 as an etch mask. In certain embodiments, patterning hard mask layer 108 includes performing a plasma etch (or other suitable etch process) to remove patterned resist layer 114 and, if applicable, one or more intervening layers (e.g., intermediate layers 110 and 112) between patterned resist layer 114 and hard mask layer 108.

At step 408, in a plasma process chamber, a self-limiting atomic layer etch process is executed to modify hard mask layer 108 (e.g., to modify one or more features 116 patterned from hard mask layer 108). As an example, the self-limiting process may be atomic layer etch process 125; however, this disclosure contemplates using any suitable self-limiting atomic layer etch process to modify hard mask layer 108. In certain embodiments, the self-limiting process includes converting, at step 408*a* a first portion of hard mask layer 108 to a first layer 126 and removing, at step 408*b*, first layer 126. As just one example, converting the first portion of hard mask layer 108 to first layer 126 (e.g., converting surface layers of features 116 of hard mask layer 108) includes oxidizing the first portion of hard mask layer 108.

In certain embodiments, converting the first portion of hard mask layer 108 to first layer 126 includes performing an anisotropic process to form first layer 126 to a first thickness along a first dimension (e.g., a vertical or lateral dimension) of hard mask layer 108 and to a second thickness along a second dimension (e.g., the other of the vertical or lateral dimension) of hard mask layer 108. The first thickness may be the same as or different than the first thickness. In certain embodiments, after removing first layer 126, the first dimension of hard mask layer 108 has changed by a first amount and the second dimension of hard mask layer 108 has changed by a second amount. The first amount may be the same as or different than the second amount.

The self-limiting process executed at step 408 may be repeated, if desired. In a scenario in which the self-limiting process is repeated, method 400 may include, after forming first layer 126 by converting the first portion of hard mask layer 108 and removing first layer 126, in the plasma process chamber, forming a second layer 126 by converting a second portion of hard mask layer 108 and removing second layer 126.

In certain embodiments, after the first step of the atomic layer etch process of method 400 (step 408) and prior to the second step of the atomic layer etch process 125 (step 410), the plasma process chamber may be purged to remove remaining gases or other materials associated with the conversion step. Additionally or alternatively, in certain embodiments, after the second step of the atomic layer etch process of method 500 (step 410) and prior to a recurrence of the first step of the atomic layer etch process of method 400 (step 408), the plasma process chamber may be purged to remove remaining gases or other materials associated with removing layer 126.

At step 410, substrate 106 is etched using modified hard mask layer 108 as an etch mask to form features 134 in substrate 106. Substrate 106 and features 116 of hard mask layer 108 may be etched using any suitable process. For example, substrate 106 and features 116 of hard mask layer 108 may be etched using a dry etch process, such as a plasma etch process. As another example, substrate 106 and features 116 of hard mask layer 108 may be etched using a wet etch process. This disclosure contemplates any suitable technique for etching substrate 106 and features 116 of hard mask layer 108. Furthermore, etching substrate 106 and features of hard mask layer 108 may include any suitable number and combination of deposition and etching steps.

Features 134 of substrate 106 resulting from the etching of substrate 106 and features 116 of hard mask layer 108 generally correspond to features 116 of hard mask layer 108. That is, hard mask layer 108 serves as an etch mask for etching substrate 106, such that features are formed in substrate 106 (features 134) that correspond to features 116 of hard mask layer 108. The potentially improved surface roughness (e.g., the smoothing) of surfaces of features 116 of hard mask layer 108 and the potentially improved maintenance of one or more critical dimensions of features 116 of hard mask layer 108 may facilitate improving the roughness (e.g., the smoothing) and critical dimension(s) of features 134 formed from etching, using hard mask layer 108 (with features 116) as an etch mask.

Method 400 ends at step 412.

Figure 5:
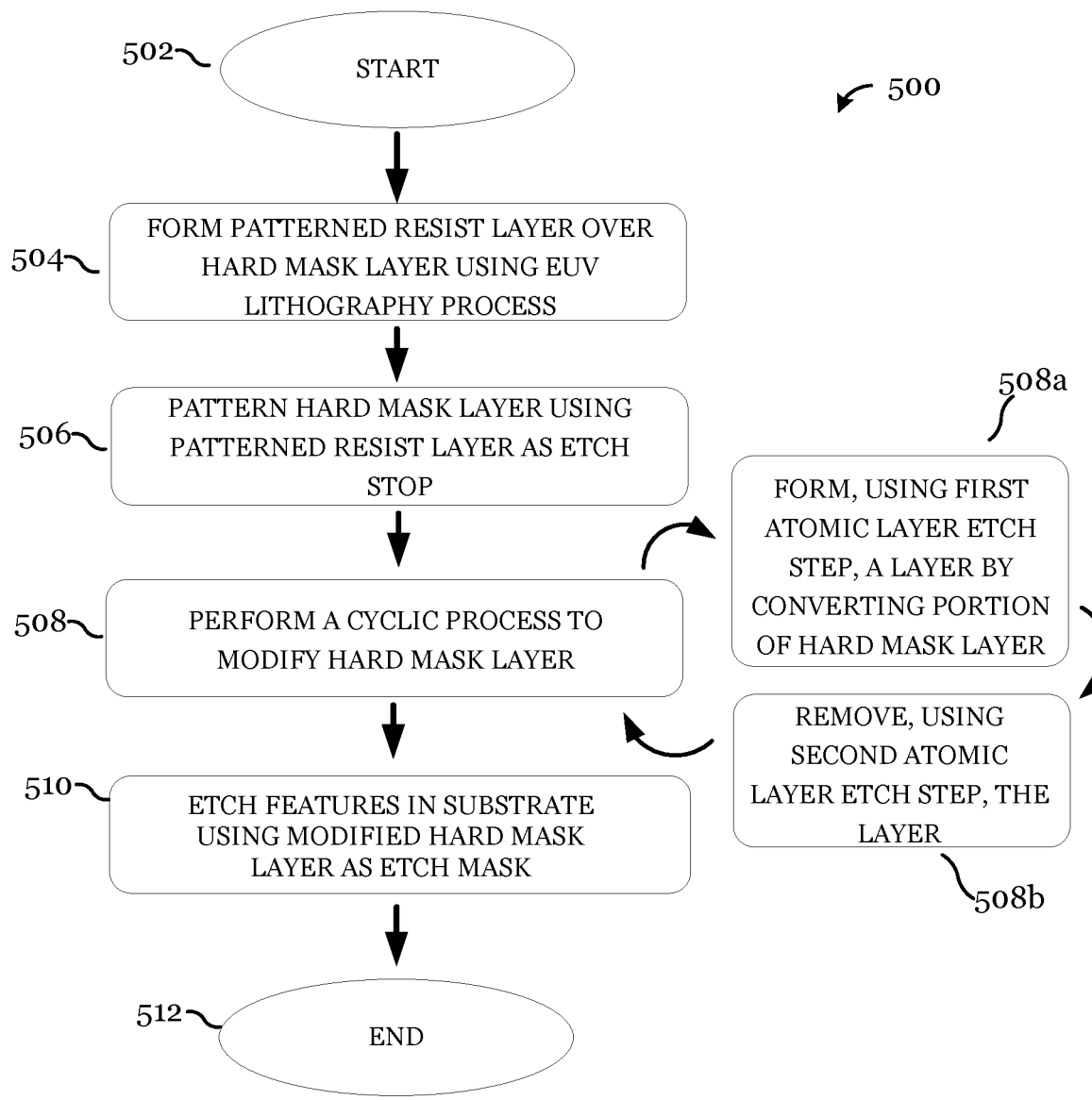
FIG. 5 illustrates an example method for forming a semiconductor device, according to certain embodiments of this disclosure.

FIG. 5 illustrates an example method 500 for forming a semiconductor device, according to certain embodiments of this disclosure. The method begins as step 502.

At step 504, patterned resist layer 114 is formed over hard mask layer 108 using an EUV lithography process. Hard mask layer 108 is formed over substrate 106. In certain embodiments, one or more intervening layers (e.g., intermediate layers 110 and 112) are formed between hard mask layer 108 and patterned resist layer 114.

At step 506, hard mask layer 108 is patterned using patterned resist layer 114 as an etch mask. In certain embodiments, patterning hard mask layer 108 includes performing a plasma etch (or other suitable etching process) to remove patterned resist layer 114 and, if applicable, one or more intervening layers (e.g., intermediate layers 110 and 112) between patterned resist layer 114 and hard mask layer 108.

At step 508, a cyclic process to modify hard mask layer 108 is performed. As one example, the cyclic process may be an atomic layer etch process 125. In certain embodiments, the cyclic process includes forming, at step 508*a*, using a first atomic layer etch step, a layer 126 by converting a portion of hard mask layer 108 and, at step 508*b*, removing the layer 126 using a second atomic layer etch step. In certain embodiments, forming layer 126 by converting the portion of hard mask layer 108 and removing layer 126 modifies a dimension of hard mask layer 108.

The cyclic nature of the cyclic process means that it can be repeated a suitable number of times to achieve features 116 of hard mask layer 108 that have desired characteristics. For example, the cyclic process may be performed a predetermined number of times. As another example, the cyclic process may be performed until hard mask layer 108 has a predetermined dimension. As a more particular example, the cyclic process may be performed until features 116 of hard mask layer 108 have approximately a desired width 118*m* and height 120*m*.

In certain embodiments, after the first step of atomic layer etch process (step 508*a*) and prior to the second step of the atomic layer etch process (step 508*b*), the plasma process chamber may be purged to remove remaining gases or other materials associated with the conversion step. Additionally or alternatively, in certain embodiments, after the second step of atomic layer etch process (step 508*b*) and prior to recurrence in the cycle of the first step of the atomic layer etch process (step 508*a*), the plasma process chamber may be purged to remove remaining gases or other materials associated with removing layer 126.

At step 510, substrate 106 is etched using modified hard mask layer 108 as an etch mask to form features 134 in substrate 106. Substrate 106 and features 116 of hard mask layer 108 may be etched using any suitable process. For example, substrate 106 and features 116 of hard mask layer 108 may be etched using a dry etch process, such as a plasma etch process. As another example, substrate 106 and features 116 of hard mask layer 108 may be etched using a wet etch process. This disclosure contemplates any suitable technique for etching substrate 106 and features 116 of hard mask layer 108. Furthermore, etching substrate 106 and features of hard mask layer 108 may include any suitable number and combination of deposition and etching steps.

Features 134 of substrate 106 resulting from the etching of substrate 106 and features 116 of hard mask layer 108 generally correspond to features 116 of hard mask layer 108. That is, hard mask layer 108 serves as an etch mask for etching substrate 106, such that features are formed in substrate 106 (features 134) that correspond to features 116 of hard mask layer 108. The potentially improved surface roughness (e.g., the smoothing) of surfaces of features 116 of hard mask layer 108 and the potentially improved maintenance of one or more critical dimensions of features 116 of hard mask layer 108 may facilitate improving the roughness (e.g., the smoothing) and critical dimension(s) of features 134 formed from etching, using hard mask layer 108 (with features 116) as an etch mask.

At step 512, method 500 ends.

Figure 6:
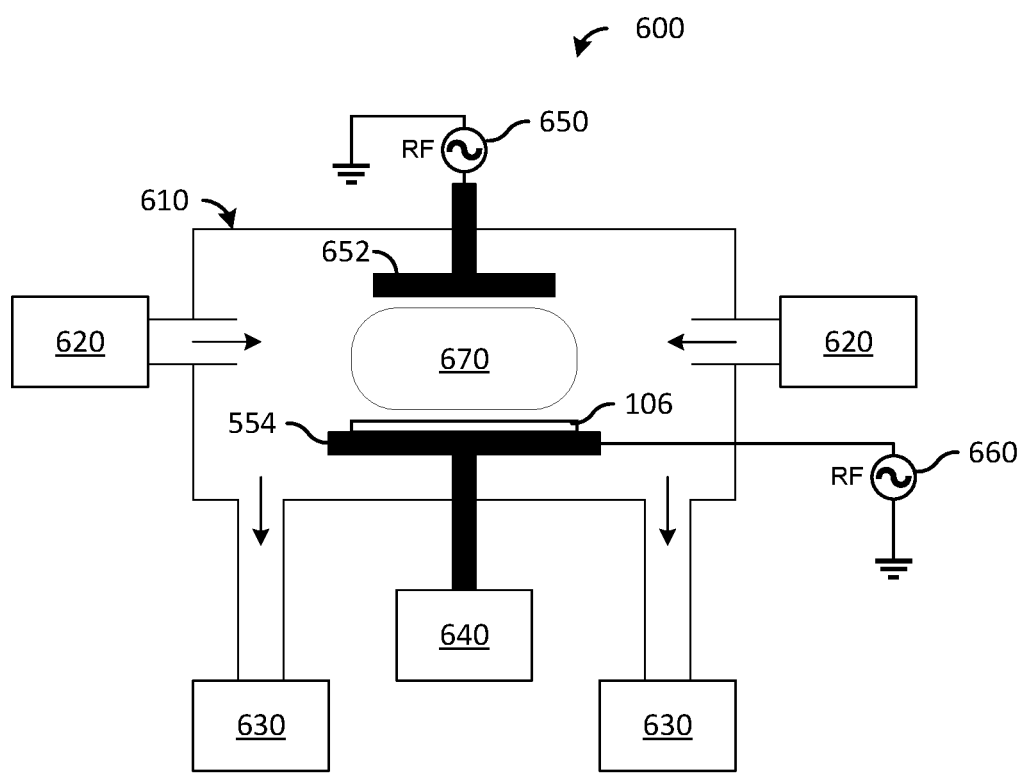
FIG. 6 illustrates a general schematic of an example plasma process system, according to certain embodiments of this disclosure.

FIG. 6 illustrates a general schematic of an example plasma process system 600, according to certain embodiments of this disclosure. Although a particular example plasma process system 600 is illustrated and described, this disclosure contemplates using any suitable type of plasma process system 600.

Plasma process system 600 includes plasma process chamber 610, gas delivery system 620, vacuum exhaust system 630, temperature controller 640, and power sources 650 and 660. Plasma process chamber 610 includes electrode 652 and substrate holder 654.

Some or all of the steps described with respect to FIGS. 1A-1C, 2A-2B, and 3-5 may be performed using plasma process system 600, with semiconductor device being position on substrate holder 654 of plasma process chamber 610. For example, to the extent a plasma etch process is used to pattern hard mask layer 108 using patterned resist layer 114 as an etch stop layer, semiconductor device 104 may be positioned in plasma process chamber 610 and exposed to a suitable plasma 670. As another example, to the extent a plasma process is used for one or both of the first and second steps of atomic layer etch process 125, substrate 106 may be positioned (or remain) in plasma process chamber 610 and exposed to one or more suitable plasmas 670.

Gas delivery system 620, vacuum exhaust system 630, temperature controller 640, power sources 650 and 660, and electrode 652 may be programmed or otherwise operated according to desired process conditions for a given processing step. For example, to the extent a plasma process is used to form layer 126, these components of plasma process system 600 may be set according to the example process conditions shown in Table 1. As another example, to the extent a plasma process is used to remove layer 126, these components of plasma process system 600 may be set according to the example process conditions shown in Table 2.

Figure 7A:
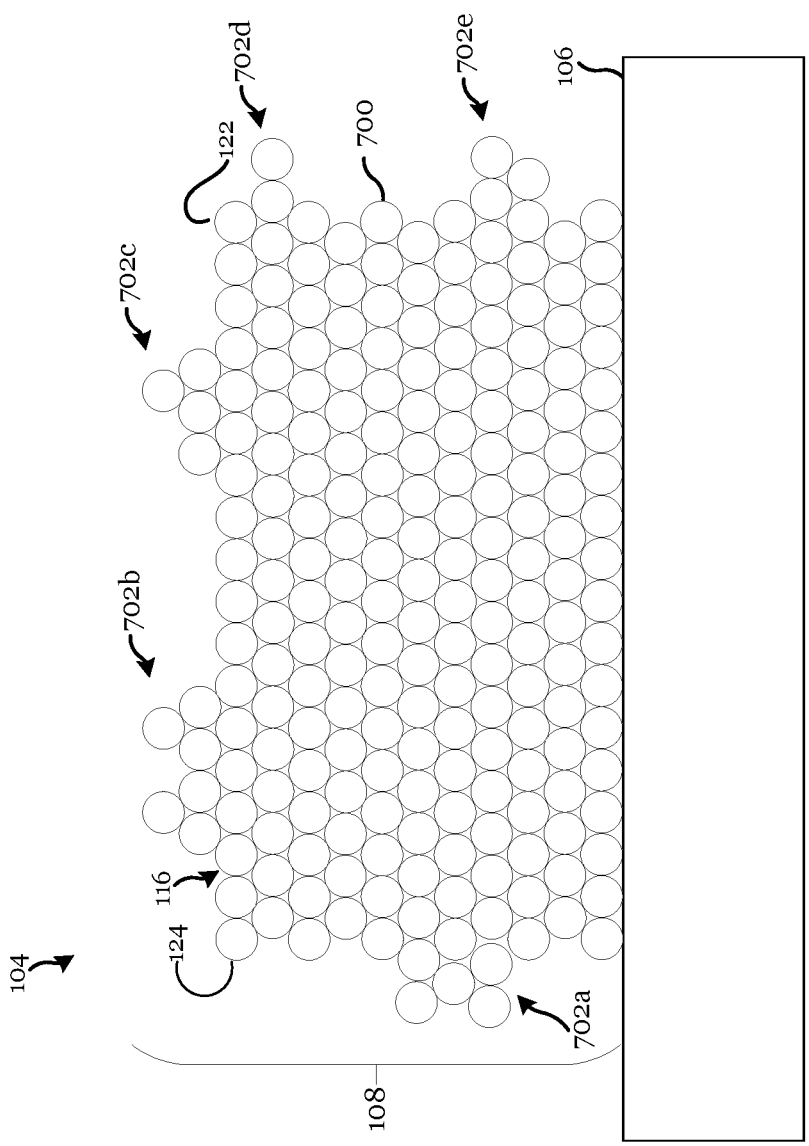
FIGS. 7A-7C illustrate an example atomic layer etch of a feature of a hard mask layer of a semiconductor device, according to certain embodiments of this disclosure.
Figure 7B:
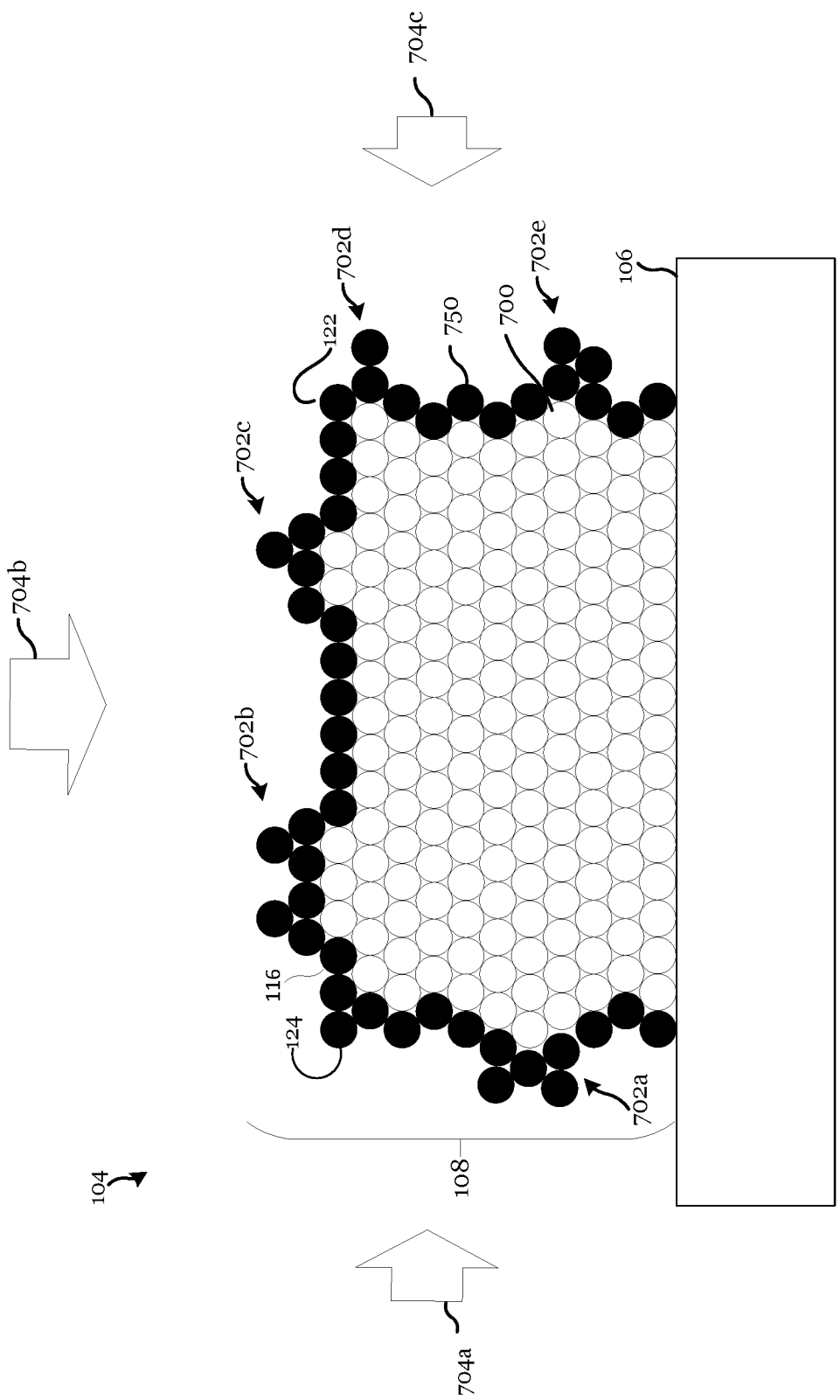
Figure 7C:
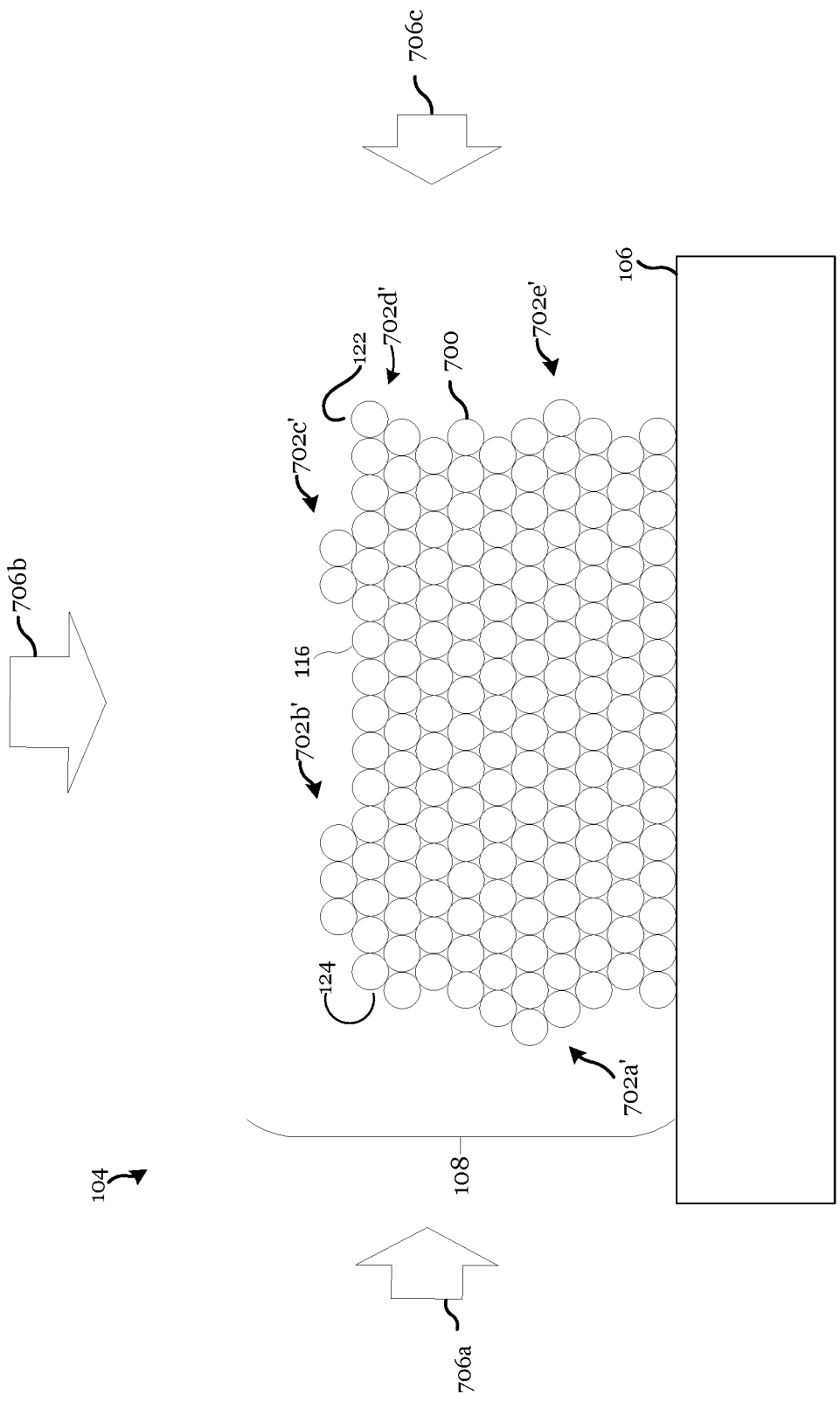

FIGS. 7A-7C illustrate an example atomic layer etch of a feature 116 of hard mask layer 108 of semiconductor device 104, according to certain embodiments of this disclosure. The atomic layer etch illustrated in FIGS. 7A-7C is provided as an example only, and this disclosure is not limited to this particular example.

As shown in FIG. 7A, feature 116 of hard mask layer 108 includes a number of particles 700. This state of feature 116 of hard mask layer 108 may correspond to a state of features 116 of semiconductor device 104 at stage 102*b* of FIG. 1A. Particles 700 can be atoms, molecules, ions, or any other suitable subdivision of hard mask layer 108.

As shown in FIG. 7A, surfaces of feature 116, both on a top surface 122 and on side surfaces 124 of feature 116, are non-linear, which creates a roughness of the surfaces 122 and 124 of feature 116. Particular areas of roughness are indicated as roughness areas 702*a* through 702*e*, which protrude from surfaces 122 and 124 of feature 116. Although this roughness is shown in a two-dimensional cross-sectional view, one of skill in the art will appreciate that feature 116 may extend in a third dimension running into and out of the page, and that variations in surfaces 122 and 124 of feature 116 may exist along that third dimension. For example, a width of feature 116 (e.g., from a first side surface 124 of feature 116 to a second side surface 124 of feature 116) at a first location in that third dimension may differ from a width of feature 116 (e.g., from the first side surface 124 of feature 116 to the second side surface 124 of feature 116) at a second location in that third dimension.

As shown in FIG. 7B, in a first stage of the atomic layer etch process 125 (e.g., corresponding to stage 102*c* in FIG. 1B), particular particles 700 of feature 116 are converted. For example, top and side surfaces 122 and 124 of feature 116 may be exposed to a substance 704*a*-704*c* to convert a thin surface layer of feature 116 to a material that will be targeted for removal in a second stage of the atomic layer etch process 125. The set of converted particles 750 shaded solid black correspond to layer 126 in FIGS. 1C and 2A-2B, for example. The set of solid black converted particles 750 may be a monolayer. In certain embodiments, the first atomic layer etch step is a plasma process, such as a plasma oxidation or plasma nitridation process, substance 704 being a plasma. This process may be self-limiting because once the surface atoms are converted, the converted atoms may prevent the atoms underlying them from being converted. Thus, the process stops after all exposed atoms are converted.

In certain embodiments, the conversion process of the first stage of the atomic layer etch process 125 is isotropic, as described above with reference to FIG. 1B. In the illustrated example of FIG. 7B, the conversion process converted one layer of particles 700 (in FIG. 7A) along the exposed surfaces of feature 116. In other embodiments, the plasma process of the first stage of the atomic layer etch process 125 is anisotropic, as described above with reference to FIGS. 2A-2B. In such an example, in the context of FIG. 7B, the converted particles 750 along one or more side surfaces 124 of feature 116 might be a first number of particles deep, and the converted particles 750 along one or more other surfaces (e.g., to surface 122 and/or another side surface 124) of feature 116 might be a second number of particles deep, with the first and second numbers of particles deep being different. For example, this could be a consequence of the greater surface area (exposure) of the particles 700 of FIG. 7A along the rough spots such as surface 122 and 124).

As an example, in one embodiment, the conversion process may be an oxidation process in which a fixed number of oxygen atoms is attached to each exposed surface atom. Alternatively, in another embodiment, the conversion process may be a nitridation process in which a fixed number of nitrogen atoms is attached to each exposed surface atom.

As next illustrated in FIG. 7C, after etching in a second atomic layer etch step, the converted particles 750 (shaded black in FIG. 7B) are removed. For example, top surface 122 and side surfaces 124 of feature 116 may be exposed to a substance 706a-706c to remove particles 750 that were converted in FIG. 7B (shaded black in FIG. 7B). The converted particles 750 may be removed using any process suitable for selectively removing converted particles 750 with minimal impact on unconverted particles 700. For example, the converted particles 750 may be removed using a wet etch process selective to removing converted particles 750. As another example, the converted particles 750 may be removed using a dry etch process (e.g., a plasma process) selective to removing converted particles 750. Again because of the selective nature of the second step, the process stops after removing the converted particles 750.

As can be seen in FIG. 7C, the smoothness of surfaces 122 and 124 of feature 116 has increased (e.g., the roughness of surfaces of feature 116 has reduced) relative to FIGS. 7A-7B, increasing the linearity of the surfaces of feature 116. Taking roughness areas 702a-702e as examples, those same roughness areas (as indicated at 702a'-702e') have reduced in size such that the surfaces 122 and 124 of feature 116 at those roughness areas 702a'-702e' has improved relative to roughness areas 702a-702e of FIG. 7A-7B.

As described above, repeating the processes of FIGS. 7B and 7C (e.g., the first and second steps of atomic layer etch process 125) may further increase the smoothness of surfaces of feature 116 (e.g., reduce the roughness of surfaces of feature 116), and thereby further increase the linearity of those surfaces of feature 116.

Regarding the example shown in and described with respect to FIGS. 7A-7C, one of skill in the art will appreciate that the representation is somewhat stylized for ease of illustrating and describing aspects of atomic layer etch process 125 and the associated smoothing in a particular example. For example, particles 700 of features 116 of hard mask layer 108 might or might not be circular/spherical and might or might not vary in shape. As another example, although the conversion process represented in FIG. 7B is understood to be self-limiting and highly controllable in certain embodiments, it might or might not be the case that each particle 700 exposed at surfaces 122 and 124 of features 116 is converted or that only those particles 700 exposed at surfaces 122 and 124 of features 116 are converted, as shown in the illustrated example.

Certain embodiments of this disclosure may provide one or more technical advantages. Certain embodiments reduce or eliminate surface/edge roughness of features 116 (e.g., patterned from hard mask layer 108). For example, atomic layer etch process 125 may facilitate reducing or eliminating surface/edge roughness of features 116 patterned from hard mask layer 108. Certain embodiments improve the ability to control critical dimensions of features 116 patterned from hard mask layer 108, including at the nanometer level. For example, atomic layer etch process 125, including in some embodiments the ability to cycle through multiple iterations of atomic layer etch process 125, may provide increased control over a lateral dimension, a vertical dimension, or both of features 116 patterned from hard mask layer 108. In certain embodiments, aspects of this disclosure, including for example atomic layer etch process 125, can be incorporated with current process and integration flow.

Example embodiments of the invention are summarized here. Other embodiments can also be understood from the entirety of the specification as well as the claims filed herein.

Example 1. A method of forming a semiconductor device, the method including: forming a patterned resist layer over a hard mask layer using an extreme ultraviolet (EUV) lithography process, the hard mask layer being disposed over a substrate; patterning the hard mask layer using the patterned resist layer as an etch mask; and smoothing the hard mask layer by forming, using a first atomic layer etch step, a first layer by converting a first portion of the hard mask layer, and removing, using a second atomic layer etch step, the first layer.

Example 2. The method of claim 1, where patterning the hard mask layer includes performing a plasma etch to remove the patterned resist layer and one or more intervening layers between the patterned resist layer and the hard mask layer.

Example 3. The method of any one of claims 1-2, further including patterning a layer of the substrate using the smoothed hard mask layer.

Example 4. The method of any one of claims 1-3, where forming, using the first atomic layer etch step, the first layer includes performing a plasma process to convert the first portion of the hard mask layer, where the plasma process includes using a plasma including oxygen.

Example 5. The method of any one of claims 1-4, where forming the first layer includes performing an isotropic process.

Example 6. The method of any one of claims 1-5, where forming the first layer includes forming the first layer to a first thickness along a first dimension of the hard mask layer and to a second thickness along a second dimension of the hard mask layer, the first thickness being different than the second thickness, where the first dimension is measured along a first direction parallel to a surface normal to a major surface of the substrate, and where the second dimension is measured along a second direction orthogonal to the first direction, where the first thickness is less than the second thickness.

Example 7. The method of any one of claims 1-6, where forming the first layer includes forming the first layer to a first thickness along a first dimension of the hard mask layer and to a second thickness along a second dimension of the hard mask layer, the first thickness being different than the second thickness, where the first dimension is measured along a first direction parallel to a surface normal to a major surface of the substrate, and where the second dimension is measured along a second direction orthogonal to the first direction, where the first thickness is greater than the second thickness.

Example 8. The method of any one of claims 1-7, where the first layer has a faster removal rate than the hard mask layer using the second atomic layer etch step.

Example 9. The method of any one of claims 1-8, where removing the first layer includes performing a wet etch to remove the first layer.

Example 10. The method of any one of claims 1-9, further including, after forming the first layer by converting the first portion of the hard mask layer and removing the first layer: forming, using the first atomic layer etch step, a second layer by converting a second portion of the hard mask layer; and removing, using the second atomic layer etch step, the second layer.

Example 11. The method of any one of claims 1-10, where forming the first layer by converting the first portion of the hard mask layer and removing the first layer reduces a critical dimension of the hard mask layer.

Example 12. A method of forming a semiconductor device, the method including: forming a patterned resist layer over a hard mask layer using an extreme ultraviolet (EUV) lithography process, the hard mask layer being disposed over a substrate; patterning the hard mask layer using the patterned resist layer as an etch mask; and in a plasma process chamber, executing a self-limiting atomic layer etch process to modify the hard mask layer, the self-limiting atomic layer etch process including: converting a first portion of the hard mask layer to a first layer, purging the plasma process chamber to remove all previously used gas chemistries, and removing the first layer.

Example 13. The method of claim 12, where converting the first portion of the hard mask layer to the first layer includes oxidizing the first portion of the hard mask layer.

Example 14. The method of any one of claims 12-13, where converting the first portion of the hard mask layer to the first layer includes performing an anisotropic process to form the first layer to a first thickness along a first dimension of the hard mask layer and to a second thickness along a second dimension of the hard mask layer, the first thickness being different than the second thickness.

Example 15. The method of claim 14, where, after removing the first layer, the first dimension of the hard mask layer has changed by a first amount and the second dimension of the hard mask layer has changed by a second amount, the first amount being different than the second amount.

Example 16. The method of any one of claims 12-15, further including, after forming the first layer by converting the first portion of the hard mask layer and removing the first layer, in the plasma process chamber: forming a second layer by converting a second portion of the hard mask layer; and removing the second layer.

Example 17. A method of forming a semiconductor device, the method including: forming a patterned resist layer over a hard mask layer using an extreme ultraviolet (EUV) lithography process, the hard mask layer being disposed over a substrate; patterning the hard mask layer using the patterned resist layer as an etch mask; and performing a cyclic process to modify the hard mask layer, the cyclic process including: forming, using a first atomic layer etch step, a layer by converting a portion of the hard mask layer, and removing, using a second atomic layer etch step, the layer.

Example 18. The method of claim 17, further including performing the cyclic process a predetermined number of times.

Example 19. The method of any one of claims 17-18, further including performing the cyclic process until the hard mask layer has a predetermined dimension.

Example 20. The method of any one of claims 17-18, where forming the layer by converting the portion of the hard mask layer and removing the layer modifies a dimension of the hard mask layer.

Although this disclosure describes or illustrates particular process/method steps as occurring in a particular order, this disclosure contemplates the process/method steps occurring in any suitable order. Moreover, this disclosure contemplates the process/method steps being repeated one or more times in any suitable order. Although this disclosure describes or illustrates particular process/method steps as occurring in sequence, this disclosure contemplates the process/method steps occurring at substantially the same time, where appropriate.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of forming a semiconductor device, the method comprising:
    forming a patterned resist layer over a hard mask layer using an extreme ultraviolet (EUV) lithography process, the hard mask layer being disposed over a substrate;
    patterning, using the patterned resist layer as an etch mask, the hard mask layer to form a feature from the hard mask layer, patterning the mask layer to form the feature from the mask layer revealing a major surface of the substrate over which the mask layer is disposed; and
    subsequently smoothing the feature formed from the hard mask layer by
        forming, using a first atomic layer etch step, a first layer by converting a first portion of the feature formed from the hard mask layer, and
        removing, using a second atomic layer etch step, the first layer.

2. The method of claim 1, wherein patterning the hard mask layer comprises performing a plasma etch to remove the patterned resist layer and one or more intervening layers between the patterned resist layer and the hard mask layer.

3. The method of claim 1, further comprising patterning a layer of the substrate using the smoothed feature formed from the hard mask layer.

4. The method of claim 1, wherein forming, using the first atomic layer etch step, the first layer comprises performing a plasma process to convert the first portion of the hard mask layer, wherein the plasma process comprises using a plasma comprising oxygen.

5. The method of claim 1, wherein forming the first layer comprises performing an isotropic process.

6. The method of claim 1, wherein forming the first layer comprises forming the first layer to a first thickness along a first dimension of the hard mask layer and to a second thickness along a second dimension of the hard mask layer, the first thickness being different than the second thickness, wherein the first dimension is measured along a first direction parallel to a surface normal to the major surface of the substrate, and wherein the second dimension is measured along a second direction orthogonal to the first direction, wherein the first thickness is less than the second thickness.

7. The method of claim 1, wherein forming the first layer comprises forming the first layer to a first thickness along a first dimension of the hard mask layer and to a second thickness along a second dimension of the hard mask layer, the first thickness being different than the second thickness, wherein the first dimension is measured along a first direction parallel to a surface normal to the major surface of the substrate, and wherein the second dimension is measured along a second direction orthogonal to the first direction, wherein the first thickness is greater than the second thickness.

8. The method of claim 1, wherein the first layer has a faster removal rate than the mask layer using the second atomic layer etch step.

9. The method of claim 1, wherein removing the first layer comprises performing a wet etch to remove the first layer.

10. The method of claim 1, further comprising, after forming the first layer by converting the first portion of the hard mask layer and removing the first layer:
   forming, using the first atomic layer etch step, a second layer by converting a second portion of the hard mask layer; and
   removing, using the second atomic layer etch step, the second layer.

11. The method of claim 1, wherein forming the first layer by converting the first portion of the hard mask layer and removing the first layer reduces a critical dimension of the mask layer.

12. A method of forming a semiconductor device, the method comprising:
   forming a patterned resist layer over a hard mask layer using an extreme ultraviolet (EUV) lithography process, the hard mask layer being disposed over a substrate;
   patterning the hard mask layer using the patterned resist layer as an etch mask; and
   in a plasma process chamber, executing a self-limiting atomic layer etch process to modify the hard mask layer, the self-limiting atomic layer etch process comprising:
      converting a first portion of the hard mask layer to a first layer,
      purging the plasma process chamber of gas chemistries used for converting the first portion of the hard mask layer to the first layer,
      removing the first layer, and
      after forming the first layer by converting the first portion of the hard mask layer and removing the first layer:
         forming a second layer by converting a second portion of the hard mask layer, and
         removing the second layer.

13. The method of claim 12, wherein converting the first portion of the hard mask layer to the first layer comprises oxidizing the first portion of the hard mask layer.

14. The method of claim 12, further comprising purging, prior to removing the second layer, the plasma process chamber of gas chemistries used for forming the second layer by converting the second portion of the hard mask layer.

15. The method of claim 12, wherein converting the first portion of the hard mask layer to the first layer comprises performing an anisotropic process to form the first layer to a first thickness along a first dimension of the hard mask layer and to a second thickness along a second dimension of the hard mask layer, the first thickness being different than the second thickness.

16. The method of claim 15, wherein, after removing the first layer, the first dimension of the hard mask layer has changed by a first amount and the second dimension of the hard mask layer has changed by a second amount, the first amount being different than the second amount.

17. A method of forming a semiconductor device, the method comprising:
   forming a patterned resist layer over a hard mask layer using an extreme ultraviolet (EUV) lithography process, the hard mask layer being disposed over a substrate;
   patterning, using the patterned resist layer as an etch mask, the hard mask layer to form a feature from the mask layer
   performing an etch process to remove the patterned resist layer and expose the feature formed from the mask layer; and
   subsequently performing a cyclic process to modify the feature formed from the hard mask layer, the cyclic process comprising:
      forming, using a first atomic layer etch step, a layer by converting a portion of the feature formed from the hard mask layer, and
      removing, using a second atomic layer etch step, the layer.

18. The method of claim 17, further comprising performing the cyclic process a predetermined number of times.

19. The method of claim 17, further comprising performing the cyclic process until a feature formed from the hard mask layer has a predetermined dimension, wherein the predetermined dimension comprises:
   a height of the feature;
   a width of the feature; or
   a combination of a height of the feature and a width of the feature.

20. The method of claim 17, wherein forming the layer by converting the portion of the hard mask layer and removing the layer modifies a dimension of the hard mask layer.

* * * * *

UNITED STATES PATENT AND TRADEMARK OFFICE
CERTIFICATE OF CORRECTION

PATENT NO. : 11,424,123 B2
APPLICATION NO. : 16/851414
DATED : August 23, 2022
INVENTOR(S) : Eric Chih-Fang Liu It is certified that error appears in the above-identified patent and that said Letters Patent is hereby corrected as shown below:

In the Claims

Claim 1, Column 24, Lines 27, 29, 32-33, 37, and 41; delete "hard".

Claim 2, Column 24, Lines 44 and 47; delete "hard".

Claim 3, Column 24, Line 50; delete "hard".

Claim 4, Column 24, Line 53; delete "hard".

Claim 6, Column 24, Lines 60-61; delete "hard".

Claim 7, Column 25, Lines 3-4; delete "hard".

Claim 10, Column 25, Lines 20 and 22; delete "hard".

Claim 11, Column 25, Line 27; delete "hard".

Claim 17, Column 26, Lines 22, 24, 27, 33, and 37; delete "hard".

Claim 17, Column 26, Line 23; delete "an extreme ultraviolet (EUV) lithography" and insert --a lithography--.

Claim 19, Column 26, Line 43; delete "hard".

Claim 20, Column 26, Lines 51-52; delete "hard".

Signed and Sealed this
Eighteenth Day of October, 2022

Katherine Kelly Vidal
*Director of the United States Patent and Trademark Office*